(12) United States Patent
Arisawa et al.

(10) Patent No.: US 11,031,935 B2
(45) Date of Patent: Jun. 8, 2021

(54) SWITCHING CIRCUIT

(71) Applicant: Panasonic Intellectual Property Management Co., Ltd., Osaka (JP)

(72) Inventors: Daijiro Arisawa, Kyoto (JP); Takeshi Azuma, Osaka (JP); Daisuke Yamamoto, Osaka (JP); Yoshihisa Minami, Shiga (JP); Manabu Yanagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/003,900

(22) Filed: Aug. 26, 2020

(65) Prior Publication Data

US 2020/0395933 A1    Dec. 17, 2020

Related U.S. Application Data

(63) Continuation of application No. PCT/JP2019/000731, filed on Jan. 11, 2019.

(30) Foreign Application Priority Data

Feb. 28, 2018  (JP) .............................. JP2018-035949

(51) Int. Cl.
*H03K 3/00*    (2006.01)
*H03K 3/017*    (2006.01)
(Continued)

(52) U.S. Cl.
CPC ............ *H03K 17/687* (2013.01); *H02M 1/08* (2013.01); *H02M 1/34* (2013.01); *H03K 17/74* (2013.01)

(58) Field of Classification Search
None
See application file for complete search history.

(56) References Cited

U.S. PATENT DOCUMENTS 8,558,587 B2 * 10/2013 Machida ............ H02M 3/1588
                                                       327/109
9,755,639 B2 *  9/2017 Kampl .................. H03K 17/74
(Continued)

FOREIGN PATENT DOCUMENTS

JP    H01-209956 A    8/1989
JP    H04-087373 A    3/1992
(Continued)

OTHER PUBLICATIONS

International Search Report issued in corresponding international Patent Application No. PCT/JP2019/000731, dated Mar. 26, 2019, with English translation.
(Continued)

*Primary Examiner* — Kenneth B Wells
(74) *Attorney, Agent, or Firm* — McDermott Will & Emery LLP

(57) ABSTRACT

A switching circuit includes; a switching element; a driver; a diode connected between a source terminal and a gate terminal of the switching element; a resistor connected between the driver and the gate terminal of the switching element; a series circuit connected in parallel with the resistor, and including a capacitor and a resistor; and a diode including an anode on a side of the gate terminal of the switching element and a cathode on a side of a second output terminal of the driver. The diode is connected in parallel with at least the capacitor out of the capacitor and the resistor connected in series.

11 Claims, 18 Drawing Sheets

(51) Int. Cl.
*H03K 17/06* (2006.01)
*H03K 17/14* (2006.01)
*H03K 17/16* (2006.01)
*H03K 17/687* (2006.01)
*H02M 1/08* (2006.01)
*H02M 1/34* (2007.01)
*H03K 17/74* (2006.01)

(56) References Cited

U.S. PATENT DOCUMENTS

| | | | |
|---|---|---|---|
| 9,923,557 B2* | 3/2018 | Osanai | H02M 1/088 |
| 9,998,111 B2* | 6/2018 | Ngo | H03K 17/165 |
| 2016/0261266 A1 | 9/2016 | Kampl et al. | |
| 2018/0013413 A1 | 1/2018 | Chuang | |
| 2018/0248540 A1 | 8/2018 | Ishii et al. | |

FOREIGN PATENT DOCUMENTS

| | | |
|---|---|---|
| JP | H04-230116 A | 8/1992 |
| JP | 2015-050864 A | 3/2015 |
| JP | 2016-40967 A | 3/2016 |
| WO | 2017/081856 A1 | 5/2017 |

OTHER PUBLICATIONS

Extended European Search Report dated Mar. 22, 2021, issued in corresponding European Patent Application No. 19761119.7.
Dimosthenis Peftitsis, et al., "Gate and Base Drivers for Silicon Carbide Power Transistors: An Overview," IEEE Transactions on Power Electronics, Institute of Electrical and Electronics Engineers, USA, vol. 31, No. 10, Oct. 1, 2016, pp. 7194-7213, XP011610988, ISSN: 0885-8993, DOI: 10.1109/TPEL.2015.2510425 (retrieved on May 20, 2016).

* cited by examiner

SWITCHING CIRCUIT

CROSS REFERENCE TO RELATED APPLICATIONS

This application is a U.S. continuation application of PCT International Patent Application Number PCT/JP2019/000731 filed on Jan. 11, 2019, claiming the benefit of priority of Japanese Patent Application Number 2018-035940 filed on Feb. 28, 2018 the entire contents of which are hereby incorporated by reference.

BACKGROUND

1. Technical Field

The present disclosure relates to a switching circuit that drives a switching element, and particularly relates to a circuit that drives a normally-off junction field-effect transistor as a switching element.

2. Description of the Related Art

Switching elements are used in devices such as switching power sources and inverters. By increasing the switching frequencies of switching elements, circuit parts such as capacitors and transformers can be reduced in size. As such switching elements for high frequency applications, normally-off junction field-effect transistors using wide-band-gap compound semiconductors, such as GaN transistors, are gaining attention in recent years.

Various techniques are conventionally proposed for switching circuits that drive normally-off junction field-effect transistors as switching elements (for example, see International Patent Application Publication No. 2017/081856 (PTL 1) and Japanese Unexamined Patent Application Publication No. 2016-40987 (PTL 2)). A transistor to be driven by a switching circuit is hereafter also simply referred to as "switching element".

PTL 1 discloses, as a drive circuit for driving a switching element, a circuit in which a plurality of resistors and one capacitor are connected between at mate terminal of the switching element and respective output terminals of a first switch element and a second switch element forming a drive signal generation circuit. This makes it possible to adjust gate charge current and discharge current of the switching element individually and optimally, and also prevent malfunctions at the time of turn on and turn off of the switching element. Hereafter, turn on and turn off of a switching element are also simply referred to as "turn on" and "turn off".

PTL 2 discloses, as a drive circuit for driving a switching element, a circuit in which a capacitor is connected, between a drive signal generation circuit and a gate terminal of the switching element and a reverse bias voltage generation circuit composed of a rectifier and a Zener diode is connected between the gate terminal and source terminal of the switching element. This speeds up turn off operation.

SUMMARY

However, the technique disclosed in PTL 1 has the following problem: An excessive negative bias is applied between the gate and source of the switching element at the time of turn off, and as a result a gate voltage resistance failure for the switching element occurs or loss (i.e. power loss) in reflux operation increases. Herein, the term "reflux operation" denotes an operation of, when current flowing to an inductive load connected to a switching element is interrupted, keeping current flowing to the inductive load through the switching element.

The technique disclosed in PTL 1 also has the following problem: To quickly discharge charge stored in the gate terminal of the switching element at the time of turn on, the resistance values of the resistors connected between the output terminal of the first switch element and the gate terminal of the switching element need to be reduced. However, there is a limit to reduction of the resistance values, because excessively low resistance values cause the gate voltage of the switching element to exceed the voltage resistance or the drive loss to increase. There is thus a limit to high-frequency operation expected of the switching element.

The technique disclosed in PTL 2 has the following problem: In the case where the gate electrode of the switching element is ohmic junction type, at the time of turn on, a current of about several mA to several tens of mA flows between the gate and the source even when the gate-source voltage is 2.3 V to 3 V, so that the gate-source voltage decreases. Thus, the turn-on state cannot be maintained.

The technique disclosed in PTL 2 also has the following problem: In the case where the drain voltage increases relative to the source potential due to an inductive load or the like when the switching element is in a turn-off state, charge current to the parasitic capacitance between the drain and the gate also flows to the capacitor connected between the drive signal generation circuit and the gate terminal of the switching element. Accordingly, the capacitor is, discharged again, and the gate-source potential increases. In the case where the increased gate-source potential exceeds a threshold of the switching element, erroneous ignition may occur. Herein, the term "erroneous ignition" denotes erroneously turning on the switching element.

In view of these problems, the present disclosure has an object of providing a switching circuit that drives a switching element and that can prevent a gate voltage resistance failure for the switching element, reduce loss in reflux operation, relax the limit to high-frequency operation of the switching element, more reliably maintain a conduction state at the time of turn on, and prevent erroneous ignition.

To achieve the object stated above, a switching circuit according to an aspect of the present disclosure includes: a normally-off junction field-effect transistor including a source terminal, a drain terminal, and a gate terminal; a driver including a first power input terminal, a first output terminal for outputting a potential of the first power input terminal or a high impedance state, a second power input terminal, a second output terminal for outputting a potential of the second power input terminal or a high impedance state, and an input terminal for switching between a first output state and a second output state, the first output state being a state in which the first output terminal outputs the potential of the first power input terminal and the second output terminal outputs the high impedance state, the second output state being a state in which the first output terminal outputs the high impedance state and the second output terminal outputs the potential of the second power input terminal; a first rectifier connected between the source terminal and the gate terminal, and including an anode on a side of the source terminal and a cathode on a side of the gate terminal; a first resistor connected between the first output terminal and the gate terminal; a series circuit connected in parallel with the first resistor, and including a capacitor and a second resistor connected in series; and a second rectifier including an anode on a side of the gate terminal and a cathode on a side of the second output terminal, wherein the source terminal is connected with the second power input terminal, and the second rectifier is connected in parallel with at least the capacitor out of the capacitor and the second resistor connected in series.

According to the present disclosure, it is possible to provide a switching circuit that drives a switching element and that can prevent a gate voltage resistance failure for the switching element, reduce loss in reflux operation, relax the limit to high-frequency operation of the switching element, more reliably maintain a conduction state at the time of turn on, and prevent erroneous ignition.

BRIEF DESCRIPTION OF DRAWINGS

These and ether objects, advantages and features of the disclosure will become apparent from the following description thereof taken in conjunction with the accompanying drawings that illustrate a specific embodiment of the present disclosure.

DETAILED DESCRIPTION OF THE EMBODIMENT (Underlying Knowledge Forming Basis of the Present Disclosure)

The inventors' underlying knowledge based on which a switching circuit according to the present disclosure was conceived will be described first.

(1) Regarding the Technique Disclosed in PTL 1

Figure 1:
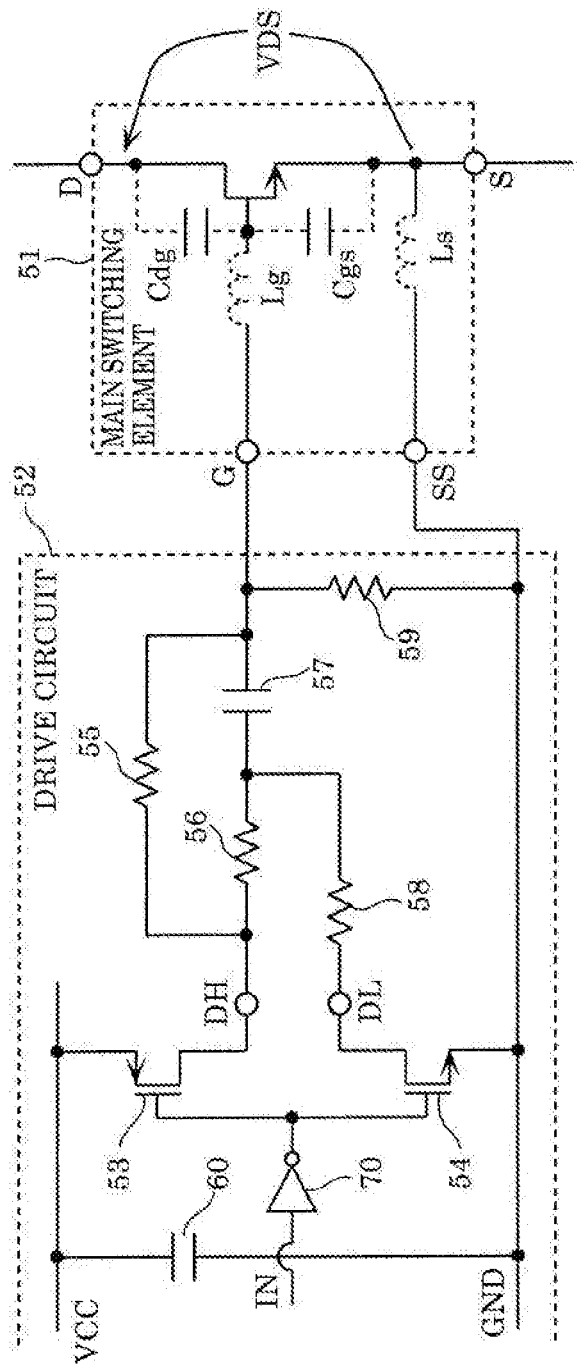
FIG. 1 is a circuit diagram of a conventional switching circuit disclosed PTL 1.

FIG. 1 is a circuit diagram of a conventional switching circuit disclosed in PTL 1. This switching circuit includes drive circuit 52 and main switching element 51. Drive circuit 52 includes: a drive signal generation circuit composed of capacitor 60, inverter 70. PMOS transistor 53, and NMOS transistor 54; and resistors 55, 56, 58, and 59 and capacitor 57 connected between the drive signal generation circuit and main switching element 51.

With such a structure, the gate current path is separated between at the time of turn on and at the time of turn off of main switching element 51, so that charge current and discharge current can be adjusted individually and optimally, and malfunctions at the time of turn on and turn off can be prevented. Hence, switching speed is adjusted for main switching element 51, and parasitic inductance in the switching circuit u reduced or the influence of parasitic inductance is suppressed. A stably controlled switching circuit is thus realized.

However, the technique disclosed in PTL 1 has the following first problem: In the case where the capacitance value of capacitor 57 or power source voltage VDD is high, an excessive negative bias is applied between the gate and source of main switching element 51 at the time of turn off, and as a result a gate voltage resistance failure for main switching element 51 occurs or loss in reflux operation increases.

The technique disclosed in PTL 1 also has the following second problem: To quickly discharge charge stored in the gate terminal of main switching element 51 at the time of turn on, the resistance values of resistors 55 and 56 need to be reduced. However, there is a limit to reduction of the resistance values of resistors 55 and 56, because excessively low resistance values cause the gate voltage of main switching element 51 to exceed the voltage resistance or the drive loss to increase. There is thus a limit to high-frequency operation expected of main switching element 51.

(2) Regarding the Technique Disclosed in PTL 2

Figure 2:
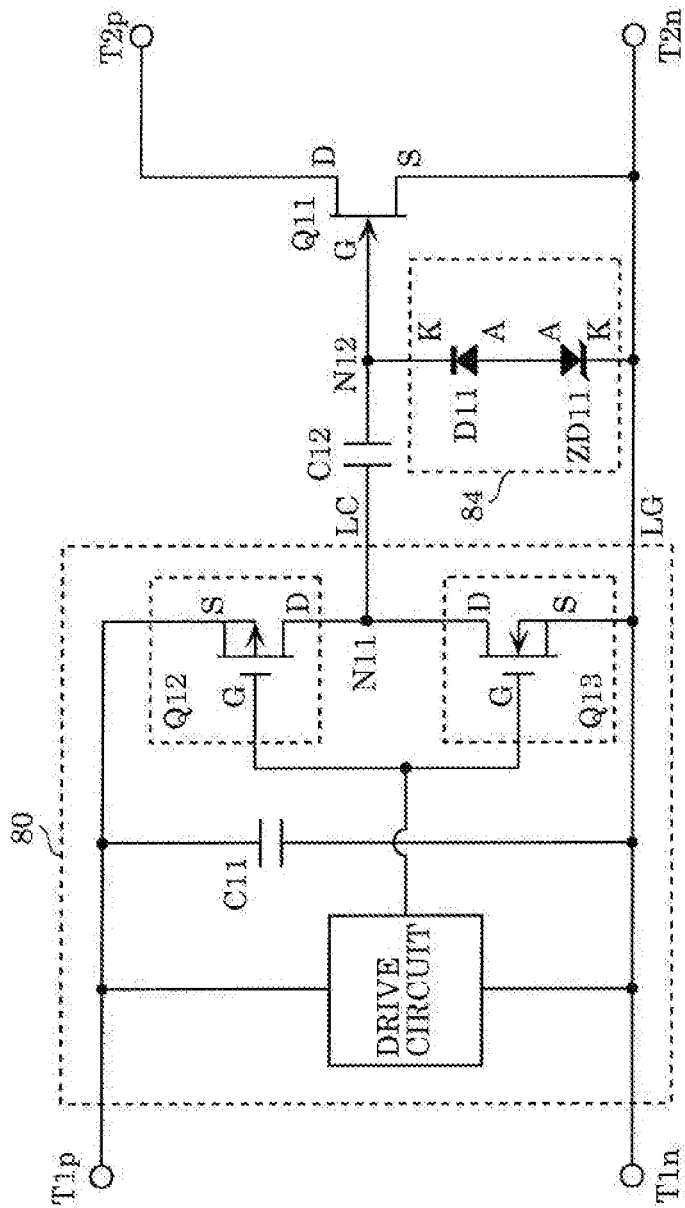
FIG. 2 is a circuit diagram of a conventional switching circuit disclosed in PTL 2.

FIG. 2 is a circuit diagram of a conventional switching circuit; disclosed in PTL 2. This switching circuit includes drive signal generation circuit SO, switching element Q11, and capacitor C12 and reverse bias voltage generation circuit 84 connected between drive signal generation circuit 80 and switching element Q11.

With such a structure, voltage division is effected by the capacitance of capacitor C12 and the input capacitance (i.e. parasitic capacitance) of switching element Q11, so that the apparent input capacitance of switching element Q11 decreases. Consequently, the voltage of the gate terminal of switching, element Q11 at the time of turn on is lowered, thus increasing the speed and efficiency of turn-on operation of switching element Q11. In addition, reverse bias voltage generation circuit 84 that is a series circuit of diode D11 and Zener diode ZD11 is connected between the gate terminal and source terminal of switching element Q11. This causes reverse bias voltage higher than in conventional techniques to be applied to the gate of switching element Q11 at the time of turn off, and thus speeds up turn-off operation of switching element Q11.

However, the technique disclosed in PTL 2 has the following third problem: In the case where the gate electrode of switching element Q11 is ohmic junction type, at the time of turn on, a current of about several mA to several tens of mA flows between the gate and the, source even when the gate-source voltage is 2.5 V to 3 V, so that the gate-source voltage decreases. Thus, the conduction state cannot be maintained.

The technique disclosed in PTL 2 also has the following fourth problem: In the case where the drain voltage increases relative to the source potential due to an inductive load or the like at the time of turn off, charge current to the parasitic capacitance between the gate and the drain also flows to capacitor C12. Accordingly, capacitor C12 is discharged again, and the gate-source potential increases. In the case where the increased gate-source potential exceeds a threshold of switching element Q11, erroneous ignition may occur.

(3) Solution

To solve the first and second problems with the technique disclosed in PTL 1 and the third and fourth problems with the technique disclosed in PTL 2, a switching circuit according to an aspect of the present disclosure includes: a normally-off junction field-effect transistor including a source terminal, a drain terminal, and a gate terminal; a driver including a first power input terminal, a first output terminal for outputting a potential of the first power input terminal or a high impedance state, a second power input terminal, a second output terminal for outputting a potential of the second power input terminal or a high impedance state, and an input terminal for switching between a first output state and a second output state, the first output state being a state in which the first output terminal outputs the potential of the first power input terminal and the second output terminal outputs the high impedance state, the second output state being a state in which the first output terminal outputs the high impedance state and the second output terminal outputs the potential of the second power input terminal; a first rectifier connected between the source terminal and the gate terminal, and including au anode on a side of the source terminal and a cathode on a side of the gate terminal; a first resistor connected between the first output terminal and the gate terminal; a series circuit connected in parallel with the first resistor, and including a capacitor and a second resistor connected in series; and a second rectifier including an anode on a side of the gate terminal and a cathode on a side of the second output terminal, wherein the source terminal is connected with the second power input terminal, and the second rectifier is connected in parallel with at least the capacitor out of the capacitor and the second resistor connected in series.

Embodiment

An embodiment of the present disclosure will be described in detail below, with respect to the drawings. The embodiment described below shows a specific example of the present disclosure. The numerical values, shapes, materials, structural elements, the arrangement and connection of the structural elements, waveforms, timings, etc. shown in the embodiment described below are mere examples, and do not limit the scope of the present disclosure. Of the structural elements in the embodiment described below, the structural elements not recited in any one of the independent claims representing the broadest concepts of the present disclosure are described as optional structural elements. Each drawing does not necessarily provide precise depiction. The substantially same structural elements are given the same reference marks throughout the drawings, and repeated description may be omitted or simplified.

Figure 3:
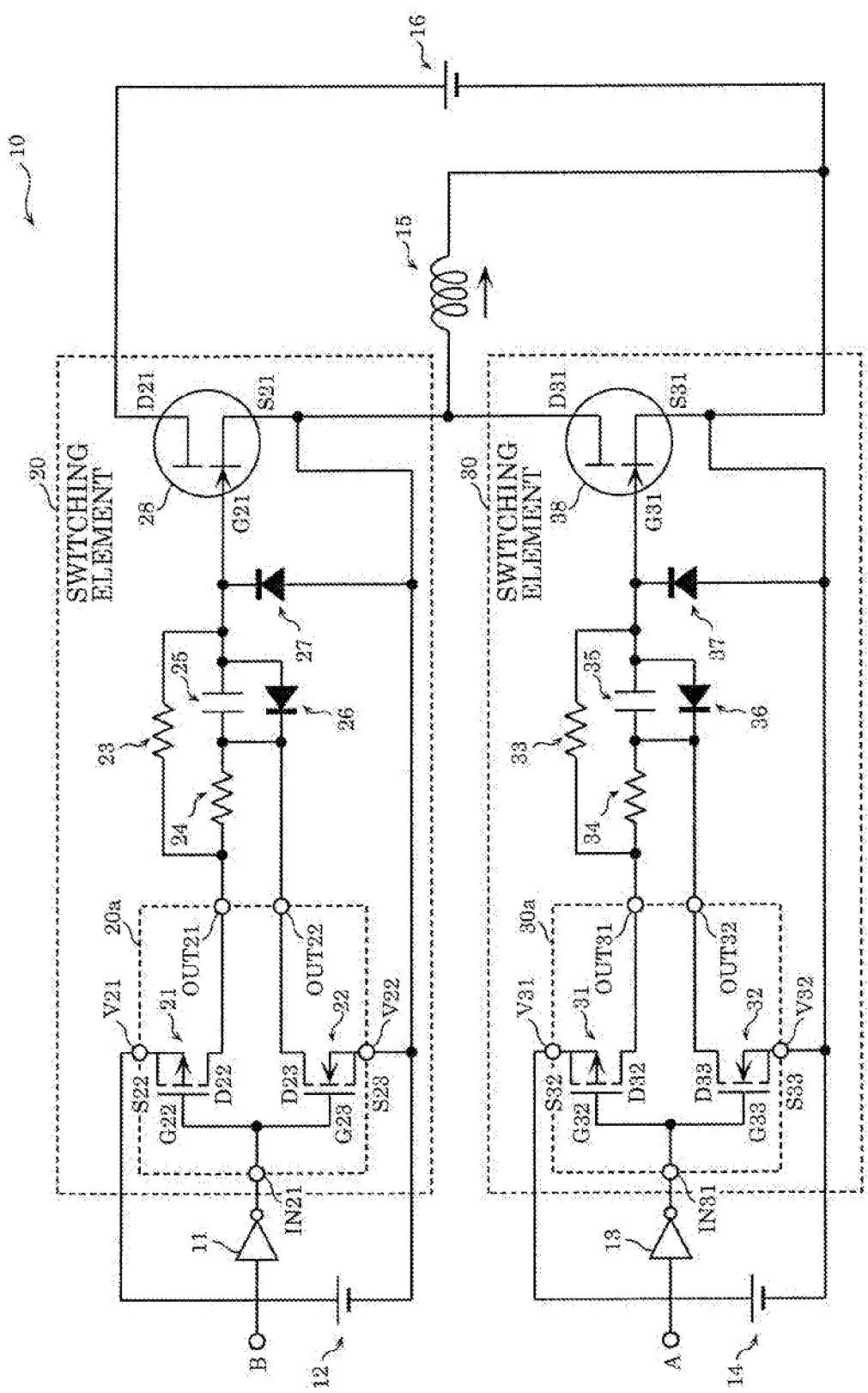
FIG. 3 is a circuit diagram of a half bridge circuit according to an embodiment.

FIG. 3 is a circuit diagram of half bridge circuit 10 according to this embodiment. Half bridge circuit 10 includes switching circuit 20, inverter 11, power source 12, and input terminal B as a high side, and switching circuit 30, inverter 13, power source 14, and input terminal A as a low side Half bridge circuit 10 also includes inductor 15 as an inductive load and load power source 16.

The high side and the low side are formed by the same circuits. A detailed structure will be described below, focusing on the high side as an example.

Power source 12 supplies DC voltage VDD to switching circuit 20.

Inverter 11 is a buffer that logically inverts a signal input to input terminal B and outputs the logically inverted signal to switching circuit 20.

Switching circuit 20 includes switching element 28, driver 20a, resistors 23 and 24, capacitor 25, and diodes 26 and 27.

Switching element 28 is a normally-off junction field-effect transistor including source terminal S21, drain terminal D21, and gate terminal G21, and is, for example, a transistor that achieves normally-off operation with high current and low on-resistance by using gallium nitride (GaN) which is a wide-bandgap compound semiconductor, Specifically, switching element 28 is, tor example, a GaN transistor, such as a gallium nitride gate injection transistor (GaN-GIT), including a gate portion composed of a p-type nitride semiconductor and a gate electrode in ohmic contact (i.e. ohmic junction) with the p-type nitride semiconductor.

A normally-off GaN transistor is easily obtained by using a p-type nitride semiconductor in its gate portion. Moreover, since the gate electrode is in ohmic contact with the p type nitride semiconductor, even when excessive positive voltage is applied to the gate, gate current easily flows. This enhances reliability. In the case where the gate electrode is in Schottky junction with the p-type nitride semiconductor, on the other hand, gate current hardly flows. However, when, excessive positive voltage is applied to the gate, the Schottky junction is reverse biased, so that the Schottky junction breaks down and the gate portion breaks easily.

Driver 20a is a drive signal generation circuit composed of switch elements 21 and 22 whose gate terminals G22 and G23 are connected to each other. Driver 20a includes first power input terminal V21, first output terminal OUT21 for outputting potential VDD of first power input terminal. V21 or a high impedance state, second power input terminal V22, second output terminal OUT22 for outputting potential GND of second power input terminal V22 or a high impedance state, and input terminal IN21 for switching between a first output state in which first output terminal OUT21 outputs potential VDD of first power input terminal V21 and second output terminal OUT22 outputs a high impedance state and a second output state in which first output terminal OUT21 outputs a high impedance state and second output terminal OUT22 outputs potential GND of second power input terminal V22, In this embodiment, switch element 21 is a PMOS transistor, and has source terminal S22 connected to first power input terminal V21 and drain terminal D22 connected to first output terminal OUT21. Switch element 22 is an NMOS transistor, and has source terminal S23 connected to second power input terminal V22 and drain terminal D23 connected to second output terminal OUT22.

Diode 27 is an example of a first rectifier connected between source terminal S21 and gate terminal G21 of switching element 28 and including an anode on the source terminal S21 side and a cathode on the gate terminal G21 side.

Resistor 23 is an example of a first resistor connected between first output terminal OUT21 and gate terminal G21 of switching element 28.

Resistor 24 is an example of a second resistor connected in series with capacitor 25. A series circuit composed of resistor 24 and capacitor 25 is connected in parallel with resistor 23.

Diode 26 is an example of a second rectifier including an anode on the gate terminal G21 side of switching element 28 and a cathode on the second output terminal OUT22 side.

Source terminal S21 of switching element 28 is connected with second power input terminal V22.

Diode 26 is connected in parallel with at least capacitor 25 out of capacitor 25 and resistor 24 connected in series. In this embodiment, diode 26 is connected in parallel with only capacitor 25 out of capacitor 25 and resistor 24 connected in series. That is, a cathode of diode 26 is connected to a point of connection between capacitor 25 and resistor 24.

Switching circuit 30 on the low side has the same structure as switching circuit 20 on the high side. That is, switching circuit 30 includes switching element 38, driver 30a, resistors 33 and 34, capacitor 35, and diodes 36 and 37. Driver 30a is composed of: switch element 31 including gate terminal G32, source terminal S32, and drain terminal D32; and switch element 32 including gate terminal G33, source terminal S33, and drain terminal D33, and includes first power input terminal V31, first output terminal OUT31, second power input terminal V32, second output terminal OUT32, and input terminal IN31.

Operation of half bridge circuit 10 according to this embodiment with the foregoing structure will be described below.

Figure 4:
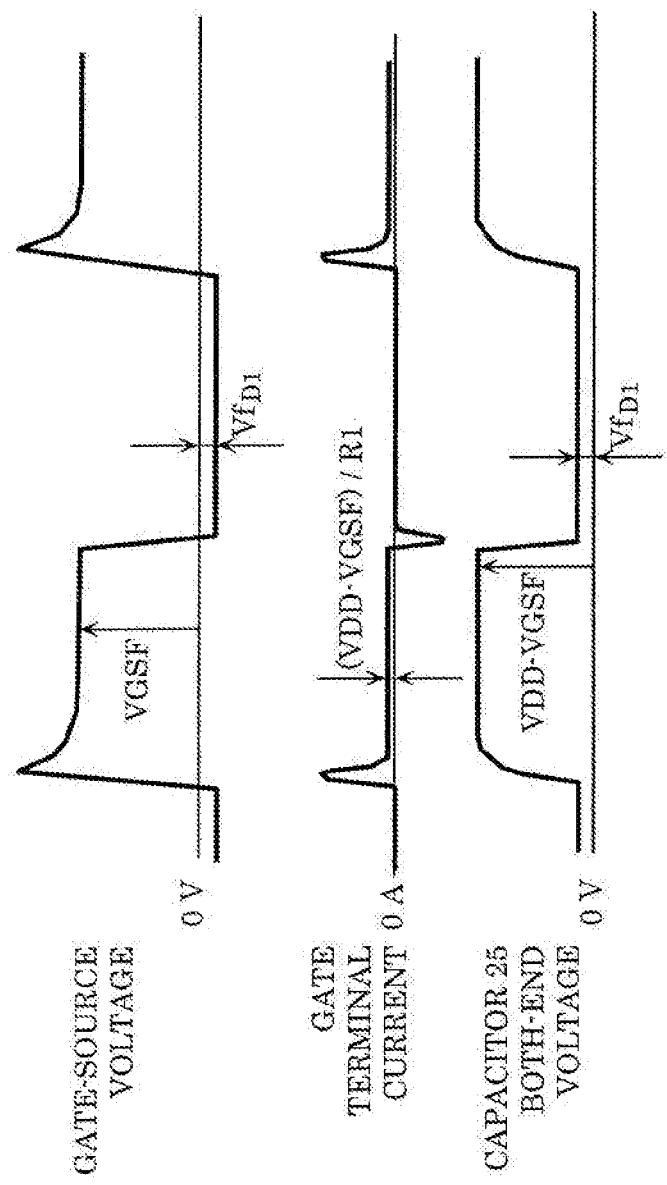
FIG. 4 is a diagram illustrating waveforms of signals relating to driving of switching elements in the half bridge circuit according to the embodiment.

FIG. 4 is a diagram illustrating waveforms of signals relating to driving of switching, elements 28 and 38 in half bridge circuit 10 according to this embodiment. Since the waveforms are the same between the high side and the low side, the waveforms on the high side are illustrated in the drawing. In the drawing, "gate-source voltage" represents the gate-source voltage of switching element 28, "gate terminal current" represents the current flowing into gate termini G21 of switching element 28, and "capacitor 25 both-end voltage" represents the waveform of the voltage between both ends of capacitor 25.

As can be seen in the waveform of "gate-source voltage", depending on whether the input signal of input terminal B is high level or low level (not illustrated), driver 20a alternates between the first output state and the second output state, and accordingly the gate-source voltage alternates between high level that turns on switching element 28 and low level that turns off switching element 28. Here, since power source voltage VDD of first power input terminal V21 is applied to gate terminal G21 of switching element 28 via resistor 23, the high level of the gate-source voltage is potential VGSF (gate clamp voltage) determined by the diode characteristics of the gate of switching element 28. Thus, the turn-on state of switching element 28 is reliably maintained by resistor 23 connected between driver 20a and gate terminal G21 of switching element 28. This solves the third problem related to PTL 2.

The low level of the gate-source voltage is negative potential $Vf_{D1}$ determined by forward voltage $Vf_{D1}$ of diode 27. In the waveform of "gate-source voltage", the rising edge overshoots due to the speed-up effect of capacitor 25. Resistor 24 connected in series with capacitor 25 has an effect of not only adjusting the speed-up effect but also suppressing oscillations of the gate-source voltage, and thus malfunctions of switching element 28 are prevented.

As can be seen in the waveform of "gate terminal current", high gate terminal current temporarily flows at the rising and falling edges of the gate-source voltage, due to the gate capacitance of switching element 28. When switching element 28 is in a steady turn-on state, the gate terminal current is a current value of (VDD−VGSF)/R1. R1 is the resistance value of resistor 23. In this way, resistor 23 adjusts the current flowing from driver 20a to switching element 28 in a steady turn-on state.

As can be seen in the waveform of "capacitor 25 both-end voltage", depending on whether the input signal of input terminal 13 is high level or low level (not illustrated), the both-end voltage of capacitor 25 alternates between a voltage during charge and a voltage during discharge. The voltage during charge is (VDD−VGSF), and the voltage during discharge is $Vf_{D1}$.

Figure 5:
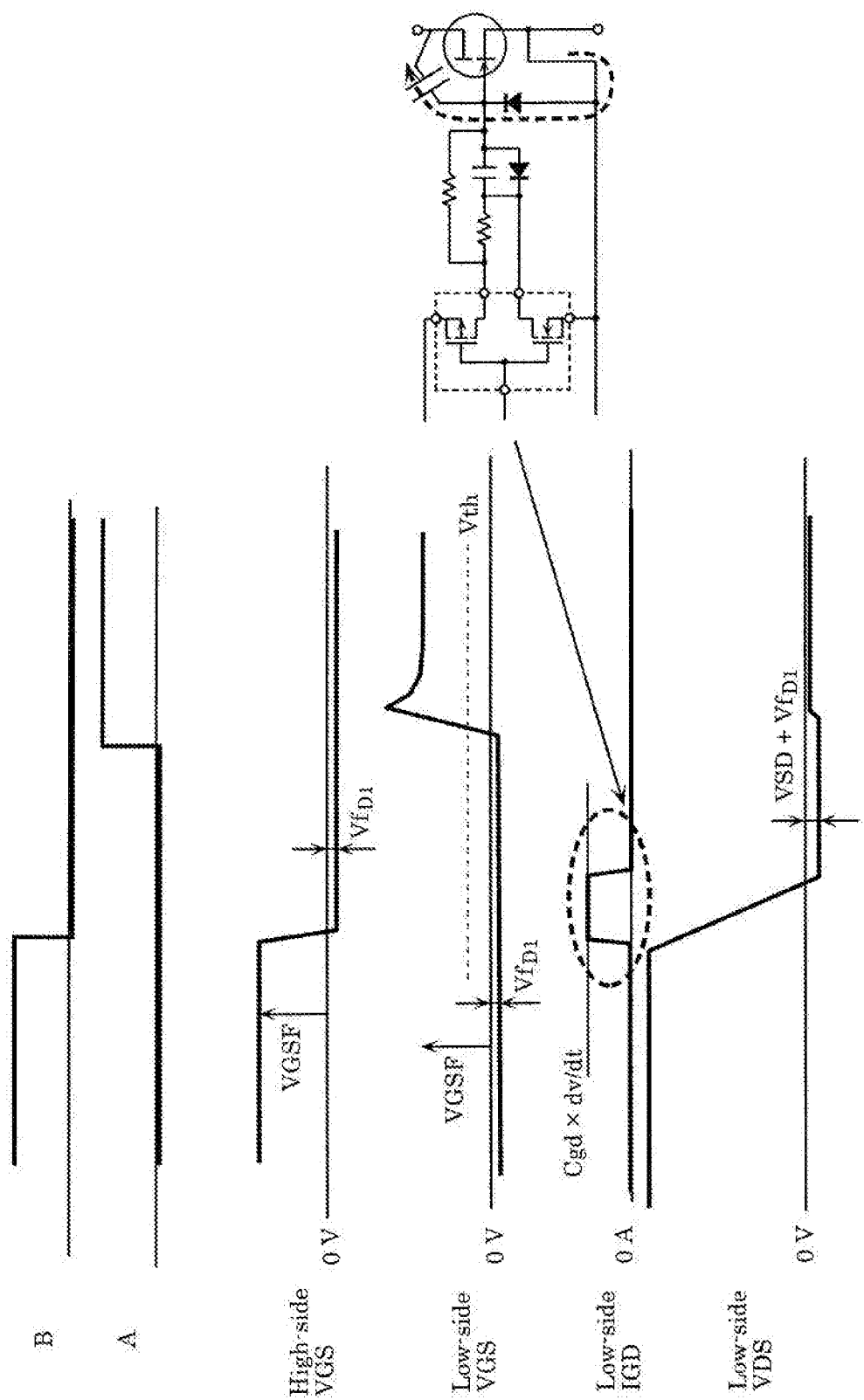
FIG. 5 is a timing chart illustrating first operation of the half bridge circuit according to the embodiment.

FIG. 5 is a timing chart illustrating first operation of half bridge circuit 10 according to this embodiment. The term "first operation" herein refers to operation in which switching element 28 on the high side changes from a turn-on state to a turn-off state and switching element 38 on tile low side changes from a turn-off state to a turn-on state. "B" represents the signal input to input terminal B on the high side, "A" represents the waveform of the signal input to input terminal A on the low side, "High-side VGS" represents the waveform of the gate-source voltage of switching element 28 on the high side, "Low-side VGS" represents the waveform of the gate-source voltage of switching element 38 on the low side, "Low-side IGD" represents the waveform of the gate-drain current of switching element 38 on the low side, and "Low-side VDS" represents the waveform of the drain-source voltage of switching element 38 on the low side.

As can be seen in the waveforms of "B" and "A", the timings when the input signal of input terminal B on the high side changes from high level to low level and the input signal of input terminal A on the low side changes from low level to high level are illustrated in the drawing.

As can be seen in the waveform of "High-side VGS", on the high side, as a result of the input signal of input terminal B changing from high level to low level, driver 20a changes from the first output state in which switch element 21 is on and switch element 22 is off to the second output state in which switch element 21 is off and switch element 22 is Consequently, gate-source voltage VGS of switching element 28 changes from high level (i.e. potential VGSF) that causes turn on to low level (i.e. negative potential $Vf_{D1}$) that causes turn off.

As can be seen in the waveform of "Low-side VGS", on the low side, as a result of the input signal of input terminal A changing from low level to high level, driver 30a changes from the second output state in which switch element 31 is off and switch element 32 is on to the first output state in which switch element 31 is on and switch element 32 is off. Consequently, gate-source voltage VOS of switching element 38 changes from low level (i.e. negative potential $Vf_{D1}$) that causes turn off to high level (i.e. potential VGSF)

that causes turn on. Voltage $Vf_{D1}$ is the, forward voltage of diode 37. Potential VGSF is the gate clamp voltage determined by the diode characteristics of the gate of switching element 38. In the drawing, "Vth" is the threshold voltage of switching element 38.

As can be seen in the waveform of "Low-side IGD", when switching element 28 on the high side changes from a turn-on state to a turn-off state, switching element 38 on the low side, although being in a turn-off state, tries to pass, from the source to drain of switching element 38, current flowing toward inductor 15, due to inductor 15 which is an inductive load. Accordingly, drain-source voltage VDS rapidly decreases, and charge stored in gate-drain capacitance CGD is rapidly discharged. Gate-drain current IGD thus flows through a path from gate terminal G31 to drain terminal D31 through gate-drain capacitance CGD. The amount of gate-drain current IGD is a value (i.e. CGD×dv/dt) determined depending on gate-drain capacitance CGD and the rate of change of both-end voltage v of gate-drain capacitance CGD. Here, the potential of gate terminal G31 of switching element 38 is clamped by diode 36, and therefore does not affect the gate potential (i.e. turn on of switching element 38 is suppressed).

As can be seen in the waveform of "Low-side VDS", on the low side, in reflux operation of switching element 38, drain-source voltage VDS of switching element 38 decreases. Meanwhile, gate-source voltage VGS is kept at a constant value (i.e. $-Vf_{D1}$) without decreasing, by diode 37. To perform reflux operation by switching element 38 passing reflux current from the source to the drain, the drain voltage needs to be lower than the gate voltage by source-drain voltage VSD. Hence, drain-source voltage VDS reaches a negative potential (specifically, negative potential (source drain voltage VSD+$Vf_{D1}$)) after the decrease. Thus, a voltage breakdown of the gate of switching element 38 and an increase of loss due to reflux operation, which are caused by an increase of the negative bias to gate terminal G31, can be prevented. This solves the first problem related to PTL 1.

Figure 6:
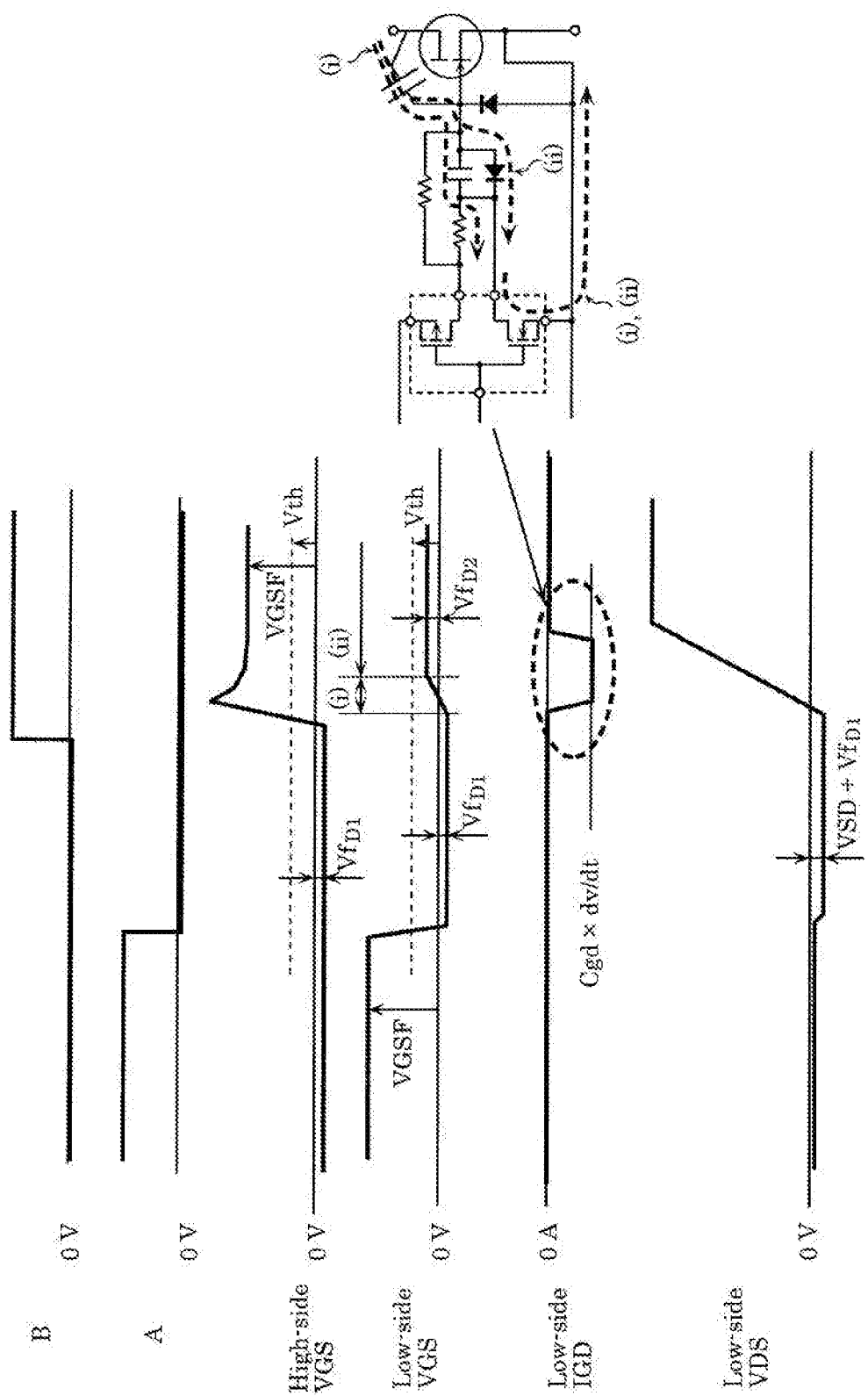
FIG. 6 is a timing chart illustrating second operation of the half bridge circuit according to the embodiment.

FIG. 6 is a timing chart illustrating second operation of half bridge circuit 10 according to this embodiment. The term "second operation" herein refers to operation in which switching element 28 on the high, side changes from a turn-off state to a turn-on state and switching element 38 on the low side changes from a turn-on state to a turn-off state. The signals illustrated in the drawing are the same as those in FIG. 5.

As can be seen in the waveforms of "B" and "A", the timings when the input signal of input terminal B on the high side changes from low level to high level and the input signal of input terminal A on the low side changes from high level to low level are illustrated in the drawing.

As can be seen in the waveform of "High-side VGS", on the high side, as a result of the input signal of input terminal B changing from low level to high level, driver 20a changes from the second output state in which switch element 21 is off and switch element 22 is on to the first output state in which switch element 21 is on and switch element 22 is off. Consequently, gate-source voltage VGS of switching element 28 changes from low level (i.e. negative potential $Vf_{D1}$) that causes turn off to high level (i.e. potential VGSF) that causes turn on. In the drawing, "Vth" is the threshold voltage of switching element 28.

As can be seen in the waveform of "Low-side VGS", on the low side, as a result of the input signal of input terminal A changing from high level to low level, driver 30a changes from the first output state in which switch element 31 is on and switch element 32 is off to the second output state in which switch element 31 is off and switch element 32 is on. Consequently, gate-source voltage VGS of switching element 38 changes from high level that causes turn on to low level (i.e. negative potential $Vf_{D1}$) that causes turn off. Subsequently, when switching element 28 on the high side is turned on (i.e. when gate-source voltage VGS changes to high level in "High-side VGS"), on the low side, voltage output from source terminal S21 of switching element 28 is applied to drain terminal D31 of switching element 38. Accordingly, voltage is applied from drain terminal D31 to gate terminal G31 via gate-drain capacitance CGD of switching element 38, and gate-source voltage VGS increases to potential $Vf_{D2}$ corresponding to the forward voltage of diode 36 for the reason given in the description of the waveform of "Low-side IGD". Potential $Vf_{D2}$ is lower than threshold voltage Vth of switching element 38. Periods (i) and (ii) in the drawing are respectively a rise period and a period after the rise in the increase of gate-source voltage VGS.

As can be seen in the waveform of "Low-side IGD", when switching element 28 on the high side is turned on (i.e. when gate-source voltage VOS changes to high level in "High-side VOS"), on the low side, voltage output from source terminal S21 of switching element 28 is applied to drain terminal D31 of switching element 38, as mentioned above. Accordingly, gate-drain current IGD (i.e. negative gate-drain current IGD) flows from drain terminal D31 of switching element 38 to GND through gate-drain capacitance CGD, gate terminal G31, the parallel circuit of capacitor 35 and diode 36, and switch element 32.

In more detail, in period (i), gate drain current IGD flows from drain terminal D31 of switching element 38 to GND through gate-drain capacitance CGD, gate terminal G31, capacitor 35, and switch element 32, and the voltage of capacitor 35 increases gradually and reaches voltage $Vf_{D2}$. After this (i.e. in period (ii)), gate drain current IGD flows from drain terminal D31 of switching element 38 to GND through gate-drain capacitance CGD, gate terminal G31, diode 36, and switch element 32, due to clamping by diode 36. Hence, gate-source voltage VGS increases to potent al $Vf_{D2}$ corresponding to the forward voltage of diode 36 but does not exceed threshold voltage Vth of switching element 38 as can be seen in the waveform of "Low-side VGS", so that erroneous ignition of simultaneously turning on switching elements 28 and 38 is prevented, This solves the fourth problem related to PTL 2. Moreover, with use of diode 36, charge stored in gate terminal G31 of switching element 38 can be quickly discharged without reducing the resistance values of resistors 33 and 34, with it being possible to relax the limit to high-frequency operation of switching element 38. This solves the second problem related to PTL 1.

As can be seen in the waveform of "Low-side VDS", when switching element 28 on the high side is turned on (i.e. when gate-source voltage VGS changes to high level in "High-side VGS"), on the low side, voltage output from source terminal S21 of switching element 28 is applied to drain terminal D31 of switching element 38 as mentioned above, as a result of which drain-source voltage VDS of switching element 38 increases.

As described above, switching circuit 30 according to this embodiment (the same applies to switching circuit 20) includes: switching element 38 that is a normally-off junction field-effect transistor including source terminal S31, drain terminal D31, and gate terminal G31; driver 30a including first power input terminal V31, first output terminal OUT31 for outputting potential VDD of first power input terminal V31 or a high impedance state, second power input terminal V32, second output terminal OUT32 for outputting potential GND of second power input terminal V32 or a high impedance state, and input terminal IN3 for switching between a first output state and a second output state, the first output state being a state in which first output terminal OUT31 outputs potential VDD of first power input terminal V31 and second output terminal OUT32 outputs the high impedance state, the second output state being a state in which first output terminal OUT31 outputs the high impedance state and second output terminal OUT32 outputs potential GND of second power input terminal V32; diode 37 that is a first rectifier connected between source terminal S31 and gate terminal G31 of switching element 38 and including an anode on the source terminal S31 side and a cathode on the gate terminal G31 side; resistor 33 that is a first resistor connected between first output terminal OUT31 and gate terminal G31 of switching element 38; a series circuit connected in parallel with the first resistor and including capacitor 35 and resistor 34 connected in series; and diode 36 that is a second rectifier including an anode on the gate terminal G31 side of switching element 38 and a cathode on the second output terminal OUT32 side. Source terminal S31 of switching element 38 is connected with second power input terminal V32, and diode 36 is connected in parallel with at least capacitor 35 (only capacitor 35 in this example) out of capacitor 35 and resistor 34 connected in series.

Since diode 37 is connected between gate terminal G31 and source terminal S31 of switching element 38, a voltage breakdown of the gate of switching element 38 and an increase of loss due to reflux operation, which are caused by an increase of the negative bias to gate terminal G31, can be prevented. This solves the first problem related to PTL 1.

Moreover, diode 36 is connected in parallel with capacitor 35, and diode 37 is connected between source terminal S31 and a connecting portion between capacitor 35 and gate terminal G31. Accordingly, when driver 30a changes from the first output state to the second output state, charge in gate terminal G31 is discharged by part of charge stored in capacitor 35 and also remaining charge stored in capacitor 35 is quickly discharged without reducing the resistance values of resistors 33 and 34, with it being possible to relax the limit to high-frequency operation of switching element 38. This solves the second problem related to PTL 1.

Moreover, resistor 33 is connected between driver 30a and gate terminal G31 of switching element 38. Thus, the turn-on state of switching element 38 is reliably maintained. This solves the third problem related to PTL 2.

Moreover, diode 36 is connected in parallel with capacitor 35. Accordingly, when switching element 28 is turned on, gate-source voltage VGS of switching element 38 in a turn-off state increases only to potential $Vf_{D2}$ corresponding to the forward voltage of diode 36. Thus, erroneous ignition of simultaneously turning on switching elements 28 and 38 is prevented. This solves the fourth problem related to PTL 2.

It is therefore possible to realize switching circuit 30 that drives switching element 38 and that can prevent a gate voltage resistance failure for switching element 38, reduce loss in reflux operation, relax the limit to high frequency operation of switching element 38, more reliably maintain a conduction state at the time of turn on, and prevent erroneous ignition.

In particular, in the case where switching elements 28 and 38 are each a GaN transistor including a gate portion composed of a p-type nitride semiconductor and a gate electrode in ohmic contact with the p-type nitride semiconductor, a current of several mA to several tens of mA can be caused to flow continuously at the time of turn on. It is therefore possible to realize a switching circuit that can prevent erroneous ignition and has high reliability.

(Variation 1)

Switching circuit 40 according to Variation 1 of the foregoing embodiment will be described below.

Figure 7:
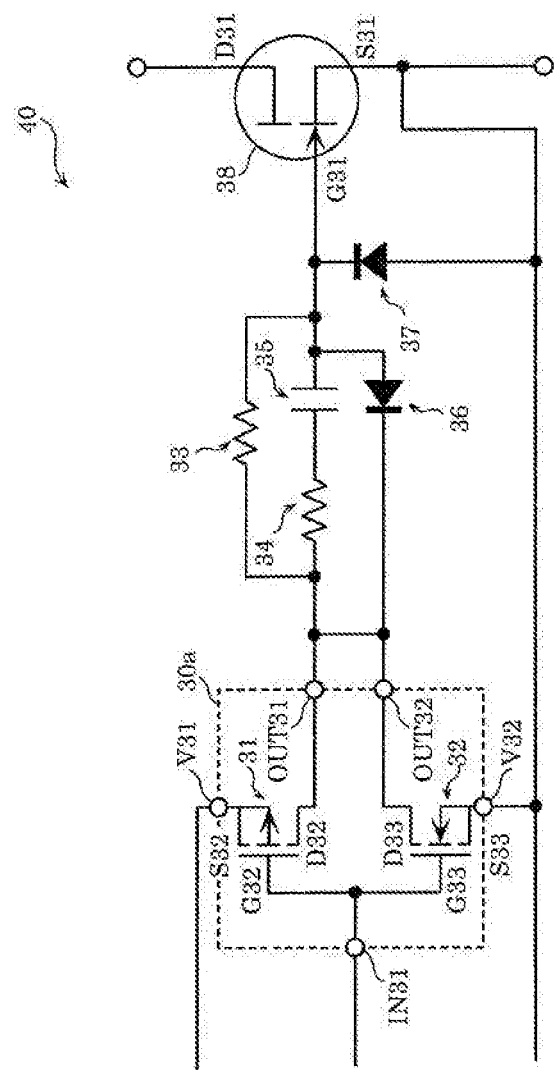
FIG. 7 is a circuit diagram of a switching circuit according to Variation 1 of the embodiment.

FIG. 7 is a circuit diagram of switching circuit 40 according to Variation 1 of the embodiment. Switching circuit 40 is a switching circuit that can replace each of switching circuits 20 and 30 according to the foregoing embodiment.

Switching circuit 40 has the same structure as switching circuits 20 and 30 according to the foregoing embodiment, except the connection configuration of diode 36. In detail, in this variation, switching circuit 40 has a structure in which diode 36 is connected in parallel with capacitor 35 and resistor 34 connected in series in switching circuit 30 according to the foregoing embodiment. Specifically, the anode of diode 36 is connected with gate terminal G31 of switching element 38, and the cathode of diode 36 is connected with a point of connection between first output terminal OUT31 and second output terminal OUT32 of driver 30a.

Figure 8:
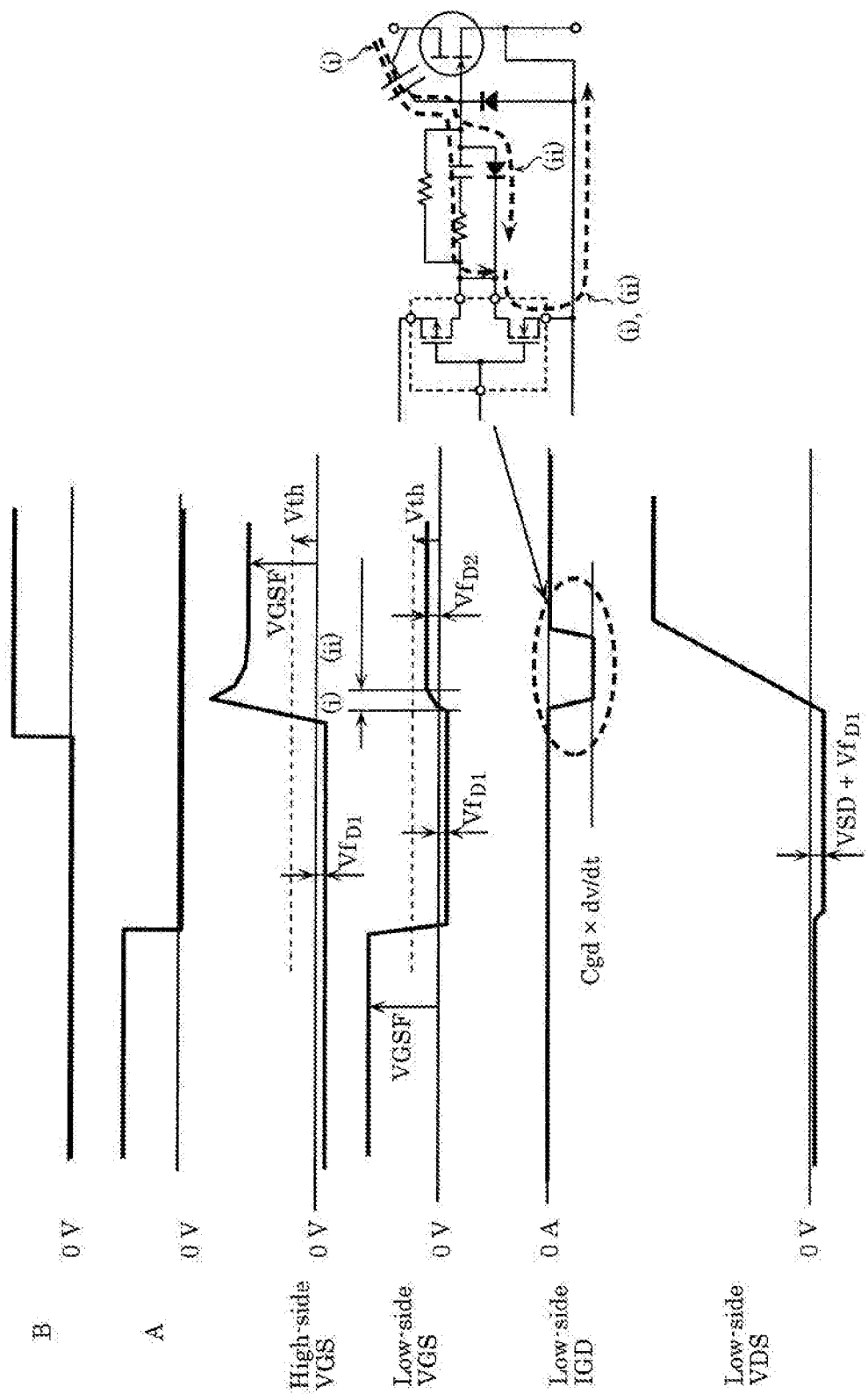
FIG. 8 is a timing chart illustrating second operation of a half bridge circuit using the switching circuit according to Variation 1 of the embodiment as a switching circuit on the low side.

FIG. 8 is a timing chart illustrating second operation of a half bridge circuit using switching circuit 40 according to Variation 1 of the embodiment as a switching circuit on the low side.

As can be seen in the waveform of "Low-side IGD", when switching element 28 on the, high side is turned on (i.e. when gate-source voltage VGS changes to high level in "High-side VGS"), on the low aide, voltage output from source terminal S21 of switching element 28 is applied to drain terminal D31 of switching element 38. In period (i), gate-drain current IGD flows from drain terminal D31 of switching element 38 to GND through gate-drain capacitance CGD, gate terminal G31, capacitor 35, resistor 34, and switch element 32, and the voltage of capacitor 35 increases gradually and reaches voltage $Vf_{D2}$. After this (i.e. in period (ii), gate-drain current Mt) flows from drain terminal D31 of switching element 38 to GND through gate-drain capacitance CGD, gate terminal G31, diode 36, and switch element 32 due to clamping by diode 36, as in the foregoing embodiment.

Hence, gate-source voltage VGS increases to potential $Vf_{D2}$ corresponding to the forward voltage of diode 36 but does not exceed threshold voltage Vth of switching element 38, so that erroneous ignition of simultaneously turning on switching elements 28 and 38 is prevented, as in the foregoing embodiment.

Moreover, since first output terminal OUT31 and second output terminal OUT32 of driver 30a are short-circuited, switching circuit 40 can be formed using driver 30a in which a common terminal serves as first output terminal OUT31 and second output terminal OUT32. That is, a drive device of one output, type can be used as driver 30a in switching circuit 30. Thus, a more versatile drive device can be used, and switching circuit 30 can be reduced in cost.

(Variation 2)

Switching circuit 41 according to Variation 2 of the foregoing embodiment will be described below.

Figure 9:
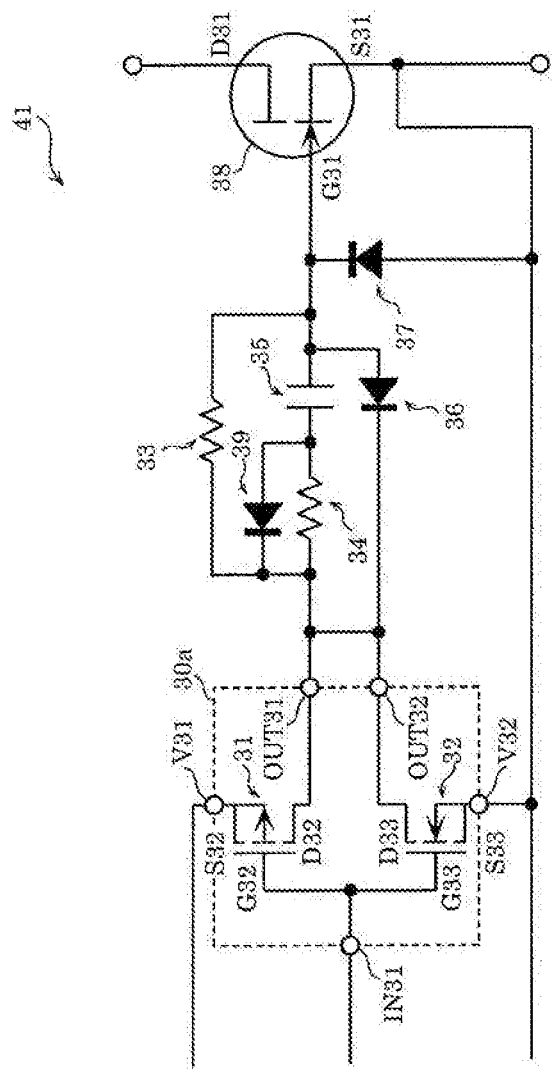
FIG. 9 is a circuit diagram of a switching circuit according to Variation 2 of the embodiment.

FIG. 9 is a circuit diagram of switching circuit 41 according to Variation 2 of the embodiment. Switching circuit 41 is a switching circuit that can replace each of switching circuits 20 and 30 according to the foregoing embodiment.

Switching circuit 41 has the same structure as switching circuit 40 according to Variation 1 of the foregoing embodiment, except that diode 39 is added. In detail, in this variation, switching circuit 41 includes, in addition to the structure of switching circuit 40 according to Variation 1 of the foregoing embodiment, diode 39 as an example of a third rectifier connected in parallel with resistor 34 and including an anode on the capacitor 35 side and a cathode on the resistor 33 side.

Figure 10:
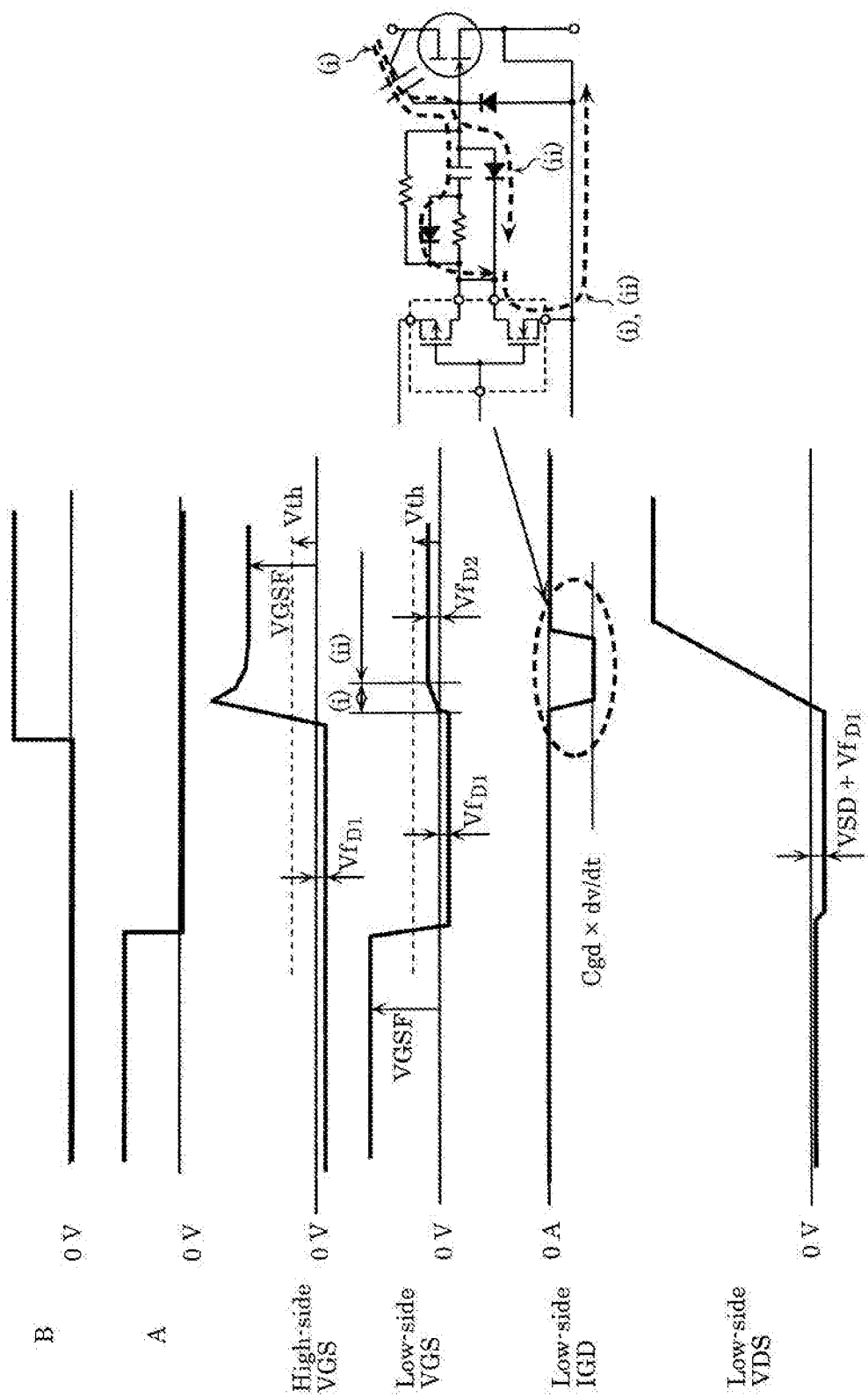
FIG. 10 is a timing chart illustrating second operation of a half bridge circuit using the switching circuit according to Variation 2 of the embodiment as a switching circuit on the low side.

FIG. 10 is a timing chart illustrating second operation of a half bridge circuit using switching circuit 41 according to Variation 2 of the embodiment as a switching circuit on the low side.

As can be seen in the waveform of "Low-side IGD", when switching element 28 on the high side is turned on (i.e. when gate-source voltage VGS changes to high level in "High-side VGS"), on the low side, voltage output from source terminal S21 of switching element 28 is applied to drain terminal D31 of switching element 38. In period (i), gate-drain current IGD flows from drain terminal D31 of switching element 38 to GND through gate-drain capacitance CGD, gate terminal G31, capacitor 35, diode 39, and switch element 32, and the voltage of capacitor 35 increases gradually and reaches voltage $Vf_{D2}$. After this (i.e. in period (ii)), gate-drain current IGD flows from drain terminal D31 of switching element 38 to GND through gate-drain capacitance CGD, gate terminal G31, diode 36, and switch element 32 due to clamping by diode 36, as in the foregoing embodiment.

That is, in period (i), gate-drain current IGD is subjected to bypass so as to flow through diode 39 instead of resistor 34.

In Variation 1, there is risk of erroneous ignition caused by voltage generated as a result of excessively high gate drain current IGD flowing through resistor 34 at the moment of turn off of switching element 28. In this variation, such risk is reduced by bypass diode 39.
(Variation 3)

Switching circuit 42 according to Variation 3 of the foregoing embodiment will be described below.

Figure 11:
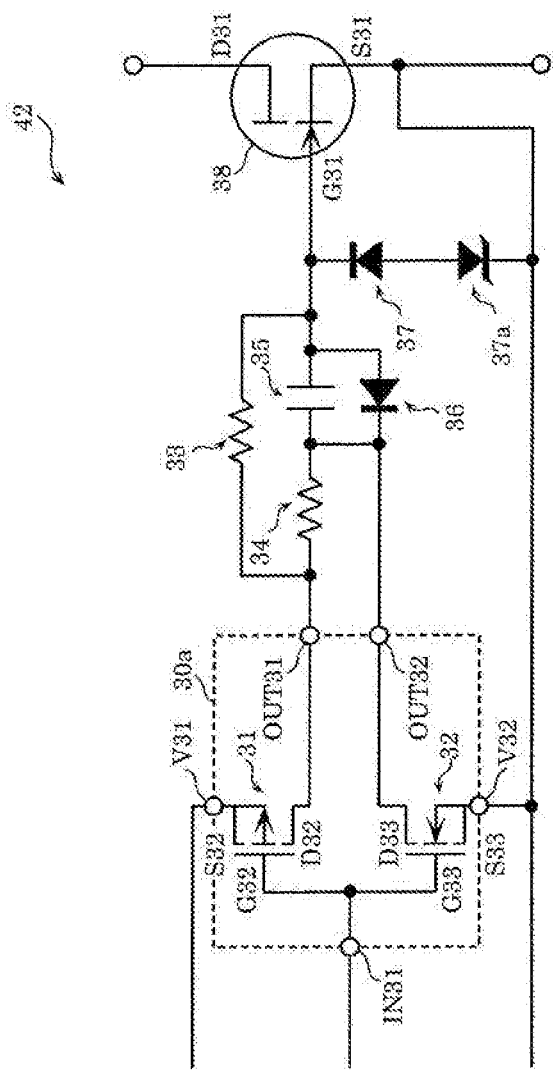
FIG. 11 is a circuit diagram of a switching circuit according to Variation 3 of the embodiment.

FIG. 11 is a circuit diagram of switching circuit 42 according to Variation 3 of the embodiment. Switching circuit 42 is a switching circuit that can replace each of switching circuits 20 and 30 according to the foregoing embodiment.

Switching circuit 42 has the same structure as switching circuits 20 and 30 according to the foregoing embodiment, except, that Zener diode 37a is added. In detail, in this variation, switching circuit 42 includes, in addition to the structure of switching circuit 20 or 30 (switching circuit 30 in this example) according to the for embodiment, Zener diode 37a connected between source terminal S31 and gate terminal G31 and in series with diode 37 and including an anode on the gate terminal G31 side and a cathode on the source terminal S31 side.

Figure 12:
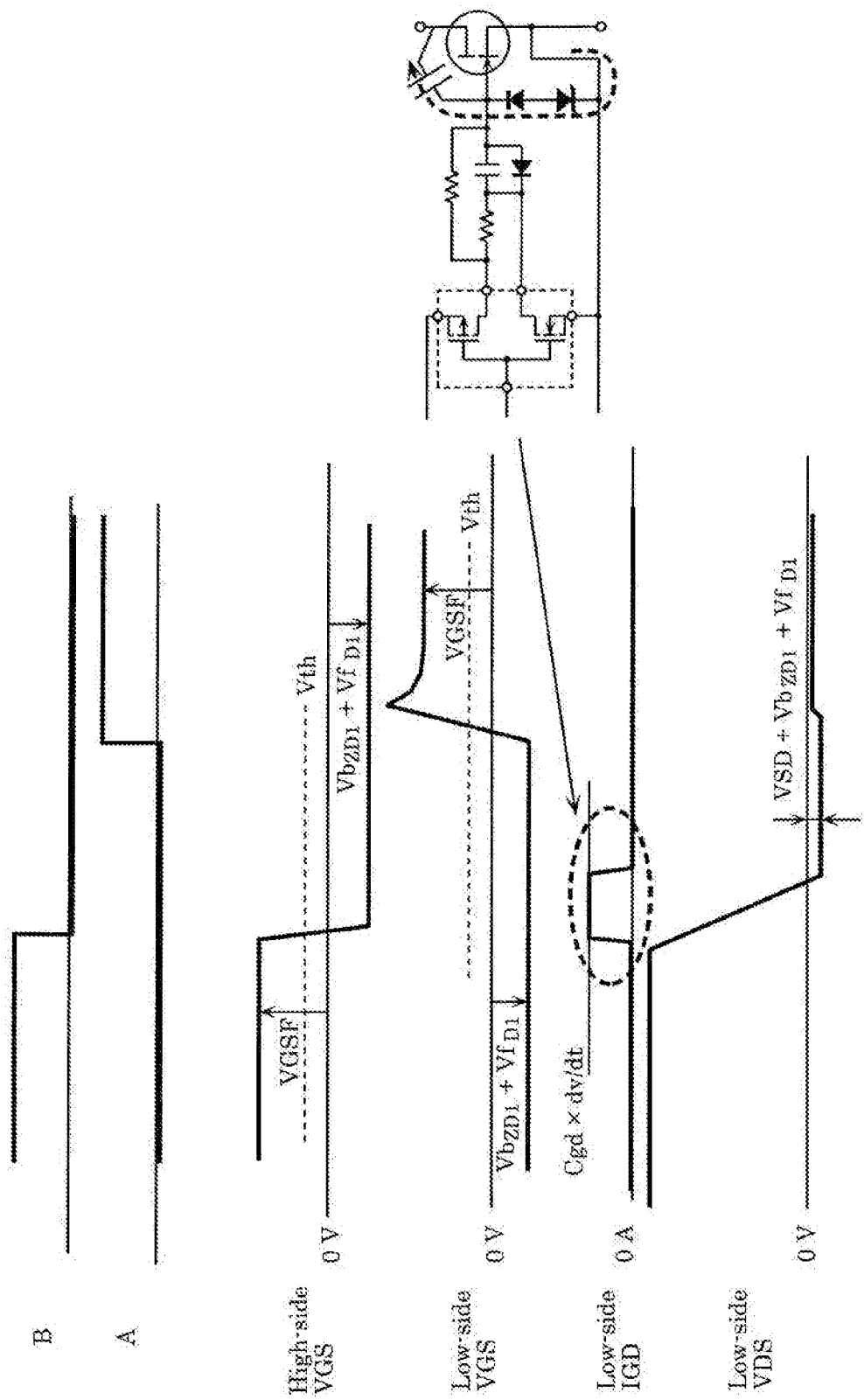
FIG. 12 is a timing chart illustrating first operation of a half bridge circuit using the switching circuit according to Variation 3 of the embodiment as switching circuits on the high side and the low side.

FIG. 12 is a timing chart illustrating first operation of a half bridge circuit using switching circuit 42 according to Variation 3 of the embodiment as switching circuits on the high side and the low side.

As can be seen in the waveform of "Low-side VGS", on the low side, as a result of the input signal of input terminal A changing from low level to high level, gate-source voltage VGS of switching element 38 changes from low level (i.e. negative potential ($Vb_{ZD1}+Vf_{D1}$)) that causes turn off to high level (i.e. potential VGSF) that causes turn on. Voltage $Vb_{ZD1}$ is the Zener voltage of Zener diode 37a. Voltage $Vf_{D1}$ is the forward voltage of diode 37.

As can be seen in the waveform of "Low side IGD", when switching element 28 on the high side changes from a turn-on state to a turnoff state, switching element 38 on the low side, although being in a turn-off state, tries to pass, from the source to drain of switching element 38, current flowing toward inductor 15, due to inductor 15 which is an inductive load. Accordingly, drain-source voltage VDS rapidly decreases, and charge stored in gate-drain capacitance CGD is rapidly discharged. Gate drain current IGD thus flows through a path from gate terminal G31 to drain terminal D31 through gate drain capacitance CGD. This gate-drain current IGD forms an induced electromotive force on parasitic inductance from gate terminal G31 to second output terminal OUT32 and from second power input terminal V32 to source terminal S31, thus causing voltage or an oscillation state. Such voltage is superimposed on gate-source voltage VGS without being clamped, by diode 36. This can pose risk of erroneous ignition. By inserting Zener diode 37a to increase the negative bias between the gate and the source and adjust the discharge amount at the time of turn oft erroneous ignition can be prevented even when voltage is superimposed due to an induced electromotive force. In addition, by selecting Zener diode 37a having different Zener voltage, the negative bias to gate terminal G31 can be finely adjusted. This eases adjustment of a tradeoff between erroneous ignition risk and loss during reflux caused by an increase in negative bias, and thus makes it possible to maximize the performance of switching element 38 that executes high-speed operation.

Figure 13:
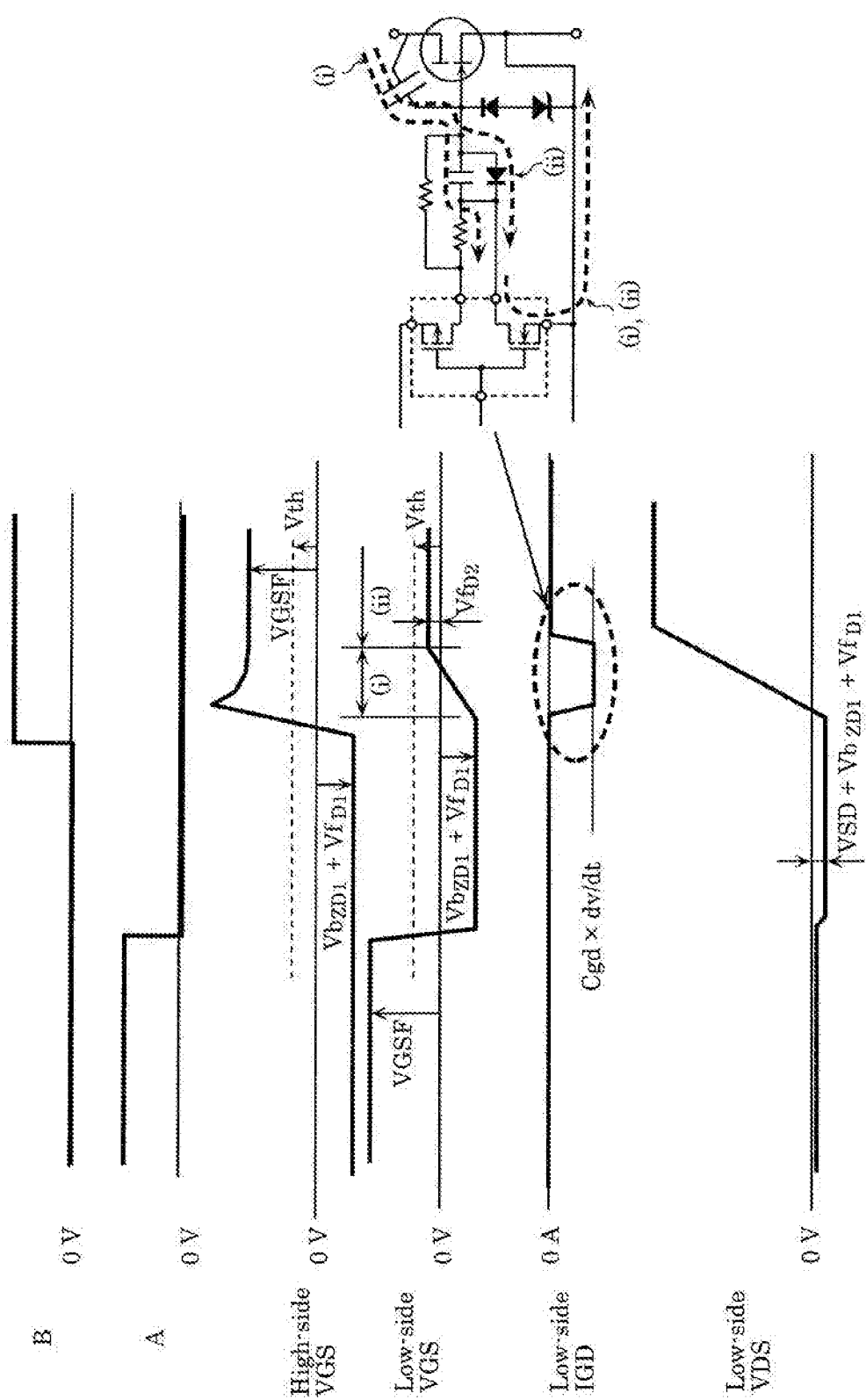
FIG. 13 is a timing chart illustrating second operation of a half bridge circuit using the switching circuit according to Variation 3 of the embodiment as switching circuits on the high side and the low side.

As can be seen in the waveform of "Low-side VDS" on the low side, in flux operation of switching element 38, drain-source voltage VDS of switching element 38 decreases. Meanwhile, gate-source voltage VGS is kept at a constant value (i.e. $-Vb_{ZD1}-Vf_{D1}$) without decreasing, by Zener diode 37a and diode 37. To perform reflux operation by switching element 38 passing reflux current from the source to the drain the drain voltage needs to be lower than the gate voltage by source-drain voltage VSD. Hence, drain-source voltage VDS reaches a negative potential (specifically, negative potential (source-drain voltage VSD+$Vb_{ZD1}$+$Vf_{D1}$)) after the decrease FIG. 13 is a timing chart illustrating second operation of a half bridge circuit using switching circuit 42 according to Variation 3 of the embodiment switching circuits o the high side and the low side.

As can be seen in the waveform of "Low-side VGS", on the low side, as a result of the input signal of input terminal A changing from high level to low level, driver 30a changes from the first output state in which switch element 31 is on and switch element 32 is off to the second output state in which switch element 31 is off and switch element 12 is on. Consequently, gate-source voltage VGS of switching element 38 changes from high level that causes turn on to low level (i.e. negative potential ($Vb_{ZD1}+Vf_{D1}$)) that causes turn off. Thus, low level of gate-source voltage VGS negatively biased, by Zener voltage $Vb_{ZD1}$ of Zener diode 37a, as compared with that in the embodiment.

As can be seen in the waveform of "Low-side IGD", when switching element 28 on the high side is turned on (i.e. when gate-source voltage VGS changes to high level in "High-side VGS"), on the low side, gate-drain current IGD flows from drain terminal D31 of switching element 38 to GND through gate-drain capacitance CGD, gate terminal G31, the parallel circuit of capacitor 35 and diode 36, and switch element 32.

In more detail, in period (i), gate-drain current IGD flows from drain terminal D31 of switching element 38 to GND through gate-drain capacitance CGD, gate terminal G31, capacitor 35, and switch element 32, and the voltage of capacitor 35 increases gradually and reaches voltage $Vf_{D2}$.

After this (i.e. in period (ii)), gate-drain current IGD flows from drain terminal D31 of switching element 38 to GND through gate-drain capacitance CGD, gate terminal G31, diode 36, and switch element 32, due to clamping by diode 36. Hence, gate-source voltage VGS increases to potential $Vf_{D2}$ corresponding to the forward voltage of diode 36 but does not exceed threshold voltage Vth of switching element 38, as can be seen in the waveform of "Low-side VGS". That is, in this variation, since the amount of negative bias remaining in capacitor 35 increases due to Zener diode 37, if the capacitance value of capacitor 35 is sufficiently high, a potential change of capacitor 35 is suppressed, and switching (turn off of switching element 38) is completed without diode 36 conducting. This reduces the risk of erroneous ignition. Thus, erroneous ignition of simultaneously turning on switching elements 28 and 38 is prevented. This solves the fourth problem related to PTL 2.

As can be seen in the waveform of "Low-side VDS", when switching element 28 on the high side is turned on (i.e. gate-source voltage VGS changes to high level in "High-aide VGS"), on the low side, voltage output from source terminal S21 of switching element 28 is applied to drain terminal D31 of switching element 38 as mentioned above, as a result of which drain-source voltage VDS of switching element 38 increases from low level (i.e. negative potential (source-drain voltage $VSD+Vb_{ZD1}+Vf_{D1}$)) to high level.

As described above, in switching circuit 42 according to this variation, Zener diode 37a is connected in series with diode 37. Therefore, negative bias of gate-source voltage VGS can be increased in reflux operation of switching element 38, and erroneous ignition risk can be reduced.

(Variation 4)

Switching, circuit 43 according to Variation 4 of the foregoing embodiment will be described below.

Figure 14:
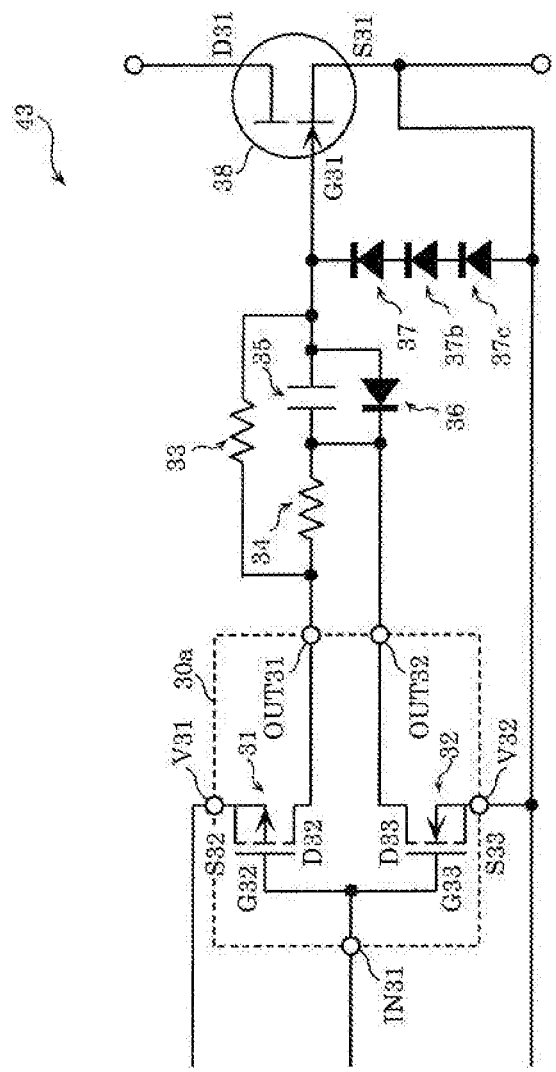
FIG. 14 is a circuit diagram of a switching circuit according to Variation 4 of the embodiment.

FIG. 14 is a circuit diagram of switching circuit 43 according to Variation 4 of the embodiment. Switching circuit 43 is a circuit in which Zener diode 37a in switching circuit 42 according to Variation 3 has been replaced with at least one rectifier (two diodes 37b and 37c in this variation). In detail, in this variation, switching circuit 43 includes, in addition to the structure of switching circuit 20 or 30 (switching circuit 30 in this example) according to the foregoing embodiment, at least one rectifier (two diodes 37b and 37c in this example) connected between source terminal S31 and gate terminal G31 and in series with diode 37 and including an anode on the gate terminal G31 side and a cathode on the source terminal S31 side.

Figure 15:
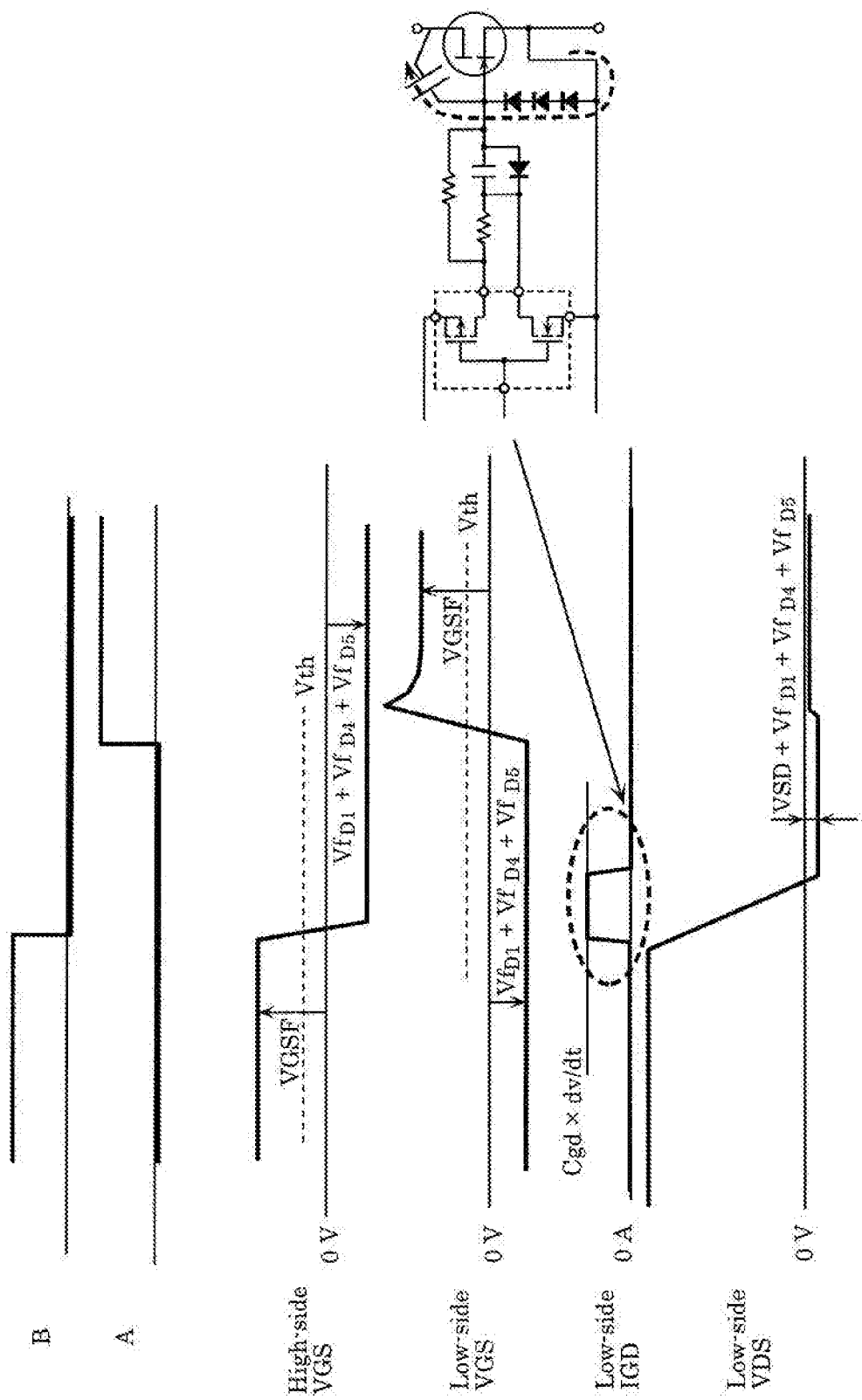
FIG. 15 is a timing chart illustrating first operation of a half bridge circuit using the switching circuit according to Variation 4 of the embodiment as switching circuits on the high side and the low side.

FIG. 15 is a timing chart illustrating first operation of a half bridge circuit using switching circuit 43 according to Variation 4 of the embodiment as switching circuits on the high side and the low side.

As can be seen in the waveform of "Low-side VGS", on the low side, as a result of the input signal of input terminal A changing from low level to high level, gate-source voltage VGS of switching element 38 changes from low level (i.e. negative potential ($Vf_{D1}+Vf_{D4}+Vf_{D5}$)) that causes, turn off to high level (i.e. potential VGSF) that causes turn on. Voltages $Vf_{D4}$ and $Vf_{D5}$ are respectively the forward voltages of diodes 37b and 37c.

As can be seen in the waveform of "Low-side IGD", when switching element 28 on the high side changes from a turn-on state to a turn-off state, switching element 38 on the low side, although being in a turn-off state, tries to pass, from the source to drain of switching element 38, current flowing toward inductor 15, due to inductor 15 which is an inductive load. Accordingly, drain-source voltage VDS rapidly decreases, and charge stored in gate-drain capacitance CGD is rapidly discharged. Gate-drain current IGD thus flows through a path from gate terminal G31 to drain terminal D31 through gate-drain capacitance CGD. This gate drain current IGD forms an induced electromotive force on parasitic inductance from gate terminal G31 to second output terminal OUT32 and from second power input terminal V32 to source terminal S31, thus causing voltage or an oscillation state. Such voltage is superimposed on gate-source voltage VGS without being clamped by diode 36. This can pose risk of erroneous ignition. By inserting diodes 37b and 37c to increase the negative bias between the gate and the source and adjust the discharge amount at the time of turn off, erroneous ignition can be prevented even when voltage is superimposed due to an induced electromotive force. In addition, by selecting diodes 37b and 37c having different forward voltages and the number of diodes 37b and 37c, the negative bias to gate terminal G31 can be finely adjusted. This eases adjustment of a tradeoff between erroneous ignition risk and loss during reflux caused by an increase in negative bias, and thus makes it possible to maximize the performance of switching element 38 that executes high-speed operation.

As can be seen in the waveform of "Low-side VDS", on the low side, in reflux operation of switching element 38, drain-source voltage VDS of switching element 38 decreases. Meanwhile, gate-source voltage VGS is kept at a constant value (specifically, negative potential (source-drain voltage $VSD+Vf_{D1}+Vf_{D4}+Vf_{D5}$)) without decreasing, by diodes 37, 37b, and 37c.

Figure 16:
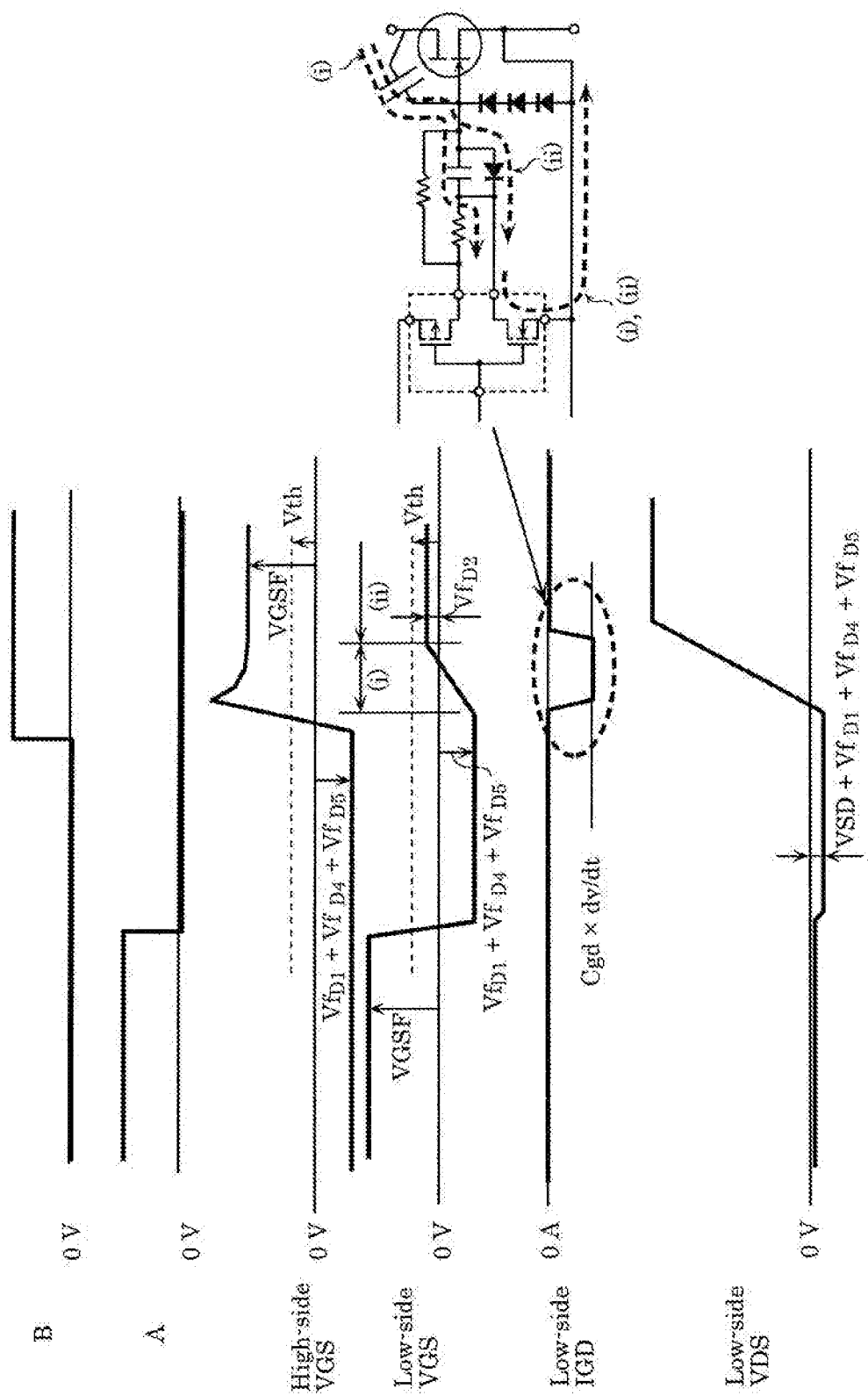
FIG. 16 is a timing chart illustrating second operation of a half bridge circuit using the switching circuit according to Variation 4 of the embodiment as switching circuits on the high side and the low side.

FIG. 16 is a timing chart illustrating second operation of a half bridge circuit using switching circuit 43 according to Variation 4 of the embodiment as switching circuits on the high side and the low side.

As can be seen in the waveform of "Low-side VGS", on the low side, as a result of the input signal of input terminal A changing from high level to low level, driver 30a changes from the first output state in which switch element 31 is on and switch element 32 is off to the second output state in which switch element 31 is off and switch element 32 is on. Consequently, gate-source voltage VGS of switching element 38 changes from high level that causes turn on to low level (i.e. negative potential ($Vf_{D1}+Vf_{D4}+Vf_{D5}$)) that causes turn off. Thus, low level of gate-source voltage VGS is negatively biased, by diodes 37b and 37c, as compared with that in the embodiment.

As can be seen in the waveform of "Low-side IGD", when switching element 28 on the high side is turned on (i.e. when gate-source voltage VGS changes to high level in "High-side VGS"), on the low side, gate-drain current IGD flows from drain terminal D31 of switching element 38 to GND through gate-drain capacitance CGD, gate terminal G31, the parallel circuit of capacitor 35 and diode 36, and switch element 32.

In more detail, in, period (i), gate-drain current IGD flows from drain terminal D31 of switching element 38 to GND through gate-drain capacitance CGD, gate terminal G31, capacitor 35, and, switch element 32, and the voltage of capacitor 35 increases gradually and reaches voltage $Vf_{D2}$. After this (i.e. in period (ii)), gate-drain current IGD flows from drain terminal D31 of switching element 38 to GND through gate-drain capacitance CGD, gate terminal G31, diode 36, and switch element 32, due to clamping by diode 36. Hence, gate-source voltage VGS increases to potential $Vf_{D2}$ corresponding to the forward voltage of diode 36 hut does not exceed threshold voltage Vth of switching element 38, as can be seen in the waveform of "Low-side VGS". That is, in this variation, since the amount of negative bias remaining in capacitor 35 increases due to diodes 37b and 37c, if the capacitance value of capacitor 35 is sufficiently high, a potential change of capacitor 35 is suppressed, and switching (turn off of switching element 38) is completed without diode 36 conducting. This reduces the risk of erroneous ignition. Thus, erroneous ignition of simultaneously turning on switching elements 28 and 38 is prevented. This solves the fourth problem related, to PTL 2.

As can be seen in the waveform of "Low-side VDS", when switching element 28 on the high side is turned on (i.e. gate-source voltage VGS changes to high level in "High-side VGS"), on the low side, voltage output from source terminal S21 of switching element 28 is applied to drain terminal D31 of switching element 38 as mentioned above, as a result of which drain-source voltage VDS of switching element 38 increases from low level (be negative potential (source drain voltage VSD+Vf$_{D1}$+Vf$_{D4}$+Vf$_{D5}$)) to high level.

As described above, in switching circuit 43 according to this variation, one or more diodes 37b and 37c are connected in series with diode 37. Therefore, negative bias of gate-source voltage VGS can be increased in reflux operation of switching element 38, and erroneous ignition risk can be reduced.

(Variation 5)

Switching circuit 44 according to Variation 5 of the foregoing embodiment will be described below.

Figure 17:
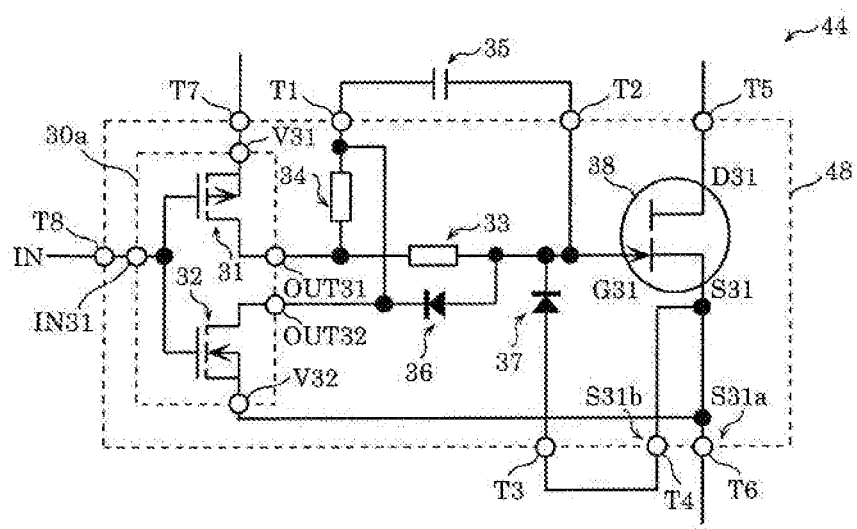
FIG. 17 is a circuit diagram of a switching circuit according to Variation 5 of the embodiment.

FIG. 17 is a circuit diagram of switching circuit 44 according to Variation 5 of the embodiment. Switching circuit 44 includes, in addition to the structure of switching circuit 20 or 30 (switching circuit 30 in this example) according to the foregoing embodiment, single package 48 containing switching element 38, first output terminal OUT31, second output terminal OUT32, diode 37, resistor 33, the series circuit of resistor 34 and capacitor 35, and diode 36. Package 48 uses, for example, resin or ceramic as a sealing material.

In this variation, switching element 38 includes, as source terminal S31, two source terminals (first source terminal S31a and second source terminal S31b). First source terminal S31a is a terminal that is connected with the source electrode of switching element 38 by a low-resistance wire and in which main current (i.e. drain current) of switching element 38 flows. Second source terminal S31b is a terminal that is connected with the source electrode of switching element 38 via a parasitic inductance and used as a reference potential when driving switching element 38. With such a structure, one of branches i.e.(second source terminal S31b) of the source electrode of switching element 38 is connected to driver 30a, thus removing the influence of main current flowing between the drain and the source on drive control of switching element 38.

Package 48 includes first terminal T1 and second terminal T2 connected with both respective ends of capacitor 35, third terminal T3 connected with the anode of diode 37, fourth terminal T4 connected with second Source terminal S31b, fifth terminal T5 connected with drain terminal D31, sixth terminal T6 connected with first source terminal S31a, seventh terminal T7 connected with first power input terminal V31, and eighth terminal T8 connected with input terminal IN31.

In this variation, in the outside of package 48, capacitor 35 is connected between first terminal T1 and second terminal T2, and third terminal T3 and fourth terminal T4 are short-circuited (i.e. connected by a wire for short-circuit (short-circuit wire)), thus realizing the same circuit structure as any of switching circuits 20 and 30 according to the foregoing embodiments.

Thus, in switching circuit 44 according to this variation, resistors 34 and 35, diodes 36 and 37, driver 30a, and switching element 38 are contained in one package. Hence, the mounting area of these parts on a circuit substrate is considerably reduced, which contributes to a smaller size of a device using switching circuit 44.

Typically, if a complex switching circuit is contained in a package, it is impossible to adjust switching characteristics in accordance with drive voltage and current specifications depending on individual applications. With switching circuit 44 according to this variation, however, switching speed can be adjusted using external capacitor 35.

Typically, in a switching circuit formed by a driver, a switching element, a resistor, and a diode, because of a large inductance component of a wire or a lead frame for semiconductor device junction or a large inductance component by a passive part or a substrate pattern in the package, steep current flowing between the drain and the gate causes voltage or an oscillation state, which increases the risk of erroneous ignition. With switching circuit 44 according to this variation, its one package configuration allows a passive part, a diode, a driver, and a switching element to be formed on one semiconductor chip, and therefore their, inductance components can be reduced. The same effect can be achieved even in the case where switching element 38 of high voltage resistance and a device of driver 30a of low voltage resistance are in separate chips.

With such packaged switching circuit 44 according to this variation, inductance components are reduced and induced voltage in response to a current change of current flowing through gate-drain capacitance is reduced. A switching circuit without erroneous ignition even in the event of faster drain-source voltage variation can therefore be realized.

Figure 18:
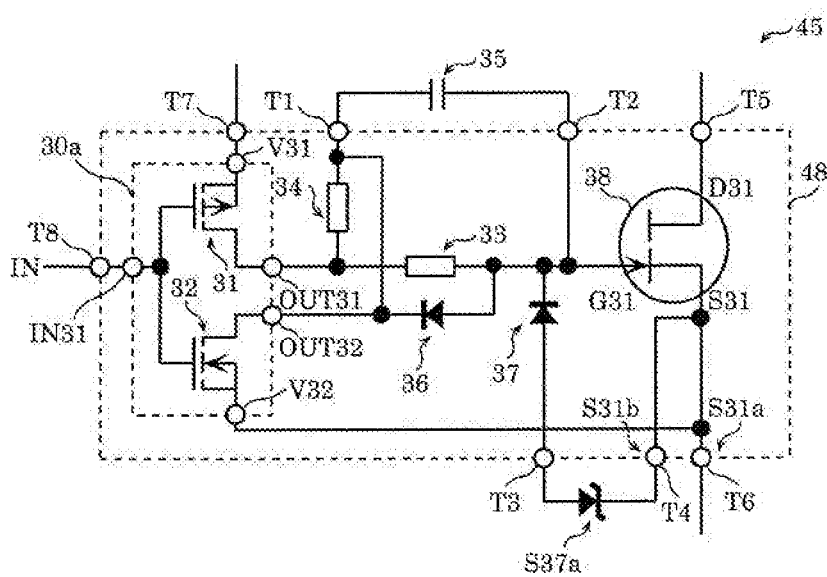
FIG. 18 is a circuit diagram of a switching circuit according to a modification of Variation 5 of the embodiment.

As in switching circuit 45 according to a modification illustrated in FIG. 18, in the outside of the package, Zener diode 37a including an anode on the third terminal T3 side and a cathode on the fourth terminal T4 side may be connected between third terminal T3 and fourth terminal T4 instead of a short-circuit wire. This realizes a package corresponding to switching circuit 42 according to Variation 3. By selecting Zener diode 37a having different Zener voltage as an external part, the negative bias to gate terminal G31 can be finely adjusted. This eases adjustment of a tradeoff between erroneous ignition risk and loss during reflux caused by an increase in negative bias, and thus makes it possible to maximize the performance of switching element 38 that executes high-speed operation.

Figure 19:
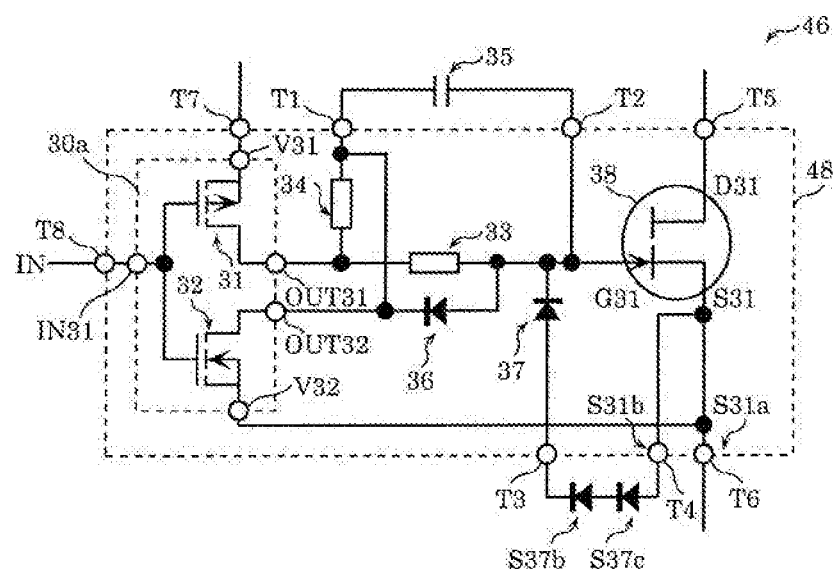
FIG. 19 is a circuit diagram of a switching circuit according to another modification of Variation 5 of the embodiment.

As in switching circuit 46 according to another modification illustrated in FIG. 19, in the outside of the package, a plurality of rectifiers (diodes 37b and 37c) connected in series and each including an anode on the third terminal T3 side and a cathode on the fourth terminal T4 side may be connected between third terminal T3 and fourth terminal T4 instead of a short-circuit wire. This realizes a package corresponding to switching circuit 43 according to Variation 4. By selecting diodes 37b and 37c having different forward voltages and the number of diodes 37b and 37c as external parts, the negative bias to gate terminal G31 can be finely adjusted. This eases adjustment of a tradeoff between erroneous ignition risk and loss during reflux caused by an increase in negative bias, and thus makes it possible to maximize the performance of switching element 38 that executes high speed operation.

While a switching circuit according to the present disclosure has been described above by way of embodiments and variations, the present disclosure is not limited to these embodiments and variations. Various modifications to the embodiments and variations conceived by a person skilled in the art and other embodiments formed by combining structural elements in the embodiments and variations without departing from the gist of the present disclosure are also included in the scope of the present disclosure.

For example, although switching elements 28 and 38 each have one source terminal in the foregoing embodiment and Variations 1 to 4, switching elements 28 and 38 may each have two source terminals as in Variation 5. In this way, the influence of main current flowing between the drain and the source on drive control of the switching element can be removed in the foregoing embodiment and Variations 1 to 4, too.

Although Zener diode 37*a* is added to the, switching circuit according to the foregoing embodiment in Variations 3 and diodes 37*b* and 37*c* are added to the switching circuit according to the foregoing embodiment in Variations 4, Zener diode 37*a* or diodes 37*b* and 37*c* may be added to the switching circuit according to Variation 1 or 2. Thus, the use of a driver of one output type can reduce the cost of the switching circuit.

Although the switching circuit according to any of the foregoing embodiment and Variations 3 and 4 is contained in a package in Variation 5, the switching circuit according to any of Variations 1 and 2 may be contained in a package. Thus, the use of a driver of one output type can reduce the cost of the packaged switching circuit.

Although two diodes 37*b* and 37*c* are connected in the switching circuit according to Variation 4 and in the switching circuit according to Variation 5 illustrated in FIG. 19 as external parts, at least one diode may be connected. The number of diodes may be determined from the perspective of adjusting the negative bias to gate terminal G31.

Circuitry contained is one package is not limited to one switching circuit, and may be a plurality of switching circuits. A drain of one switching circuit and a source of another switching circuit may be connected to form a half bridge circuit and contained in a package. The number of half bridge circuits is not limited to one, and a plurality of half bridge circuits may be used.

Although switching elements 28 and 38 are each a GaN transistor including a gate electrode of ohmic junction in the foregoing embodiment, the switching element may be a GaN transistor including a gate electrode of Schottky junction. Any of these types of GaN transistors may be used as a switching element for high-frequency applications that achieves normally-off operation with high current and low on-resistance.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure can be used as a switching circuit for driving a normally-off switching element, and particularly a switching circuit forming a half bridge circuit without erroneous ignition, e.g. a switching circuit used in a device such as a switching power source or an inverter.

What is claimed is:

1. A switching circuit, comprising;
  a normally-off junction field-effect transistor including a source terminal, a drain terminal, and a gate terminal;
  a driver including a first power input terminal, a first output terminal for outputting a potential of the first power input terminal or a high impedance state, a second power input terminal a second output terminal for outputting a potential of the second power input terminal or a high impedance state, and an input terminal for switching between a first output state and a second output state, the first output state being a state in which the first output terminal outputs the potential of the first power input terminal and the second output terminal outputs the high impedance state, the second output state being a state in which the first output terminal outputs the high impedance state and the second output terminal outputs the potential of the second power input terminal;
  a first rectifier connected between the source terminal and the gate terminal, and including an anode on a side of the source terminal and a cathode on a side of the gate terminal;
  a first resistor connected between the first output terminal and the gate terminal;
  a series circuit connected in parallel with the first resistor, and including a capacitor and a second resistor connected in serves; and
  a second rectifier including an anode on aside of the gate terminal and a cathode on a side of the second output terminal,
  wherein the source terminal is connected with the second power input terminal, and
  the second rectifier is connected in parallel with at least the capacitor out of the capacitor and the second resistor connected in series.

2. The switching circuit according to claim 1,
  wherein the second rectifier is connected in parallel with only the capacitor out of the capacitor and the second resistor connected in series.

3. The switching circuit according to claim 1,
  wherein the second rectifier is connected in parallel with the capacitor and the second resistor connected in series.

4. The switching circuit according to claim 3, further comprising
  a third rectifier connected in parallel with the second resistor, and including an anode on a side of the capacitor and a cathode on a side of the first resistor.

5. The switching circuit according to claim 1, further comprising:
  a Zener diode connected between the source terminal and the gate terminal and in series with the first rectifier, and including an anode on a side of the gate terminal and a cathode on a side of the source terminal.

6. The switching circuit according to claim 1, further comprising:
  at least one rectifier connected between the source terminal and the gate terminal and in series with the first rectifier, and including an anode on a side of the source terminal and a cathode on a side of the gate terminal.

7. The switching circuit according to claim 1, further comprising:
  a single package containing the normally-off junction field-effect transistor, the first output terminal, the second output terminal, the first rectifier, the first resistor, the series circuit, and the second rectifier, wherein the single package includes a first, terminal and a second terminal connected with respective ends of the capacitor, a third terminal connected with the anode of the first rectifier, and a fourth terminal connected with the source terminal.

8. The switching circuit according to claim 7, further comprising:

a wire located outside the single package to short-circuit the third terminal and the fourth terminal.

9. The switching circuit according to claim 7, further comprising:

a Zener diode located outside the single package, connected, between the third terminal and the fourth terminal, and including an anode on a side of the third terminal and a cathode on a side of the fourth terminal.

10. The switching circuit according to claim 7, further comprising:

a plurality of rectifiers connected in series, located outside the single package, connected between the third terminal and the fourth terminal, and each including an anode on a side of the fourth terminal and a cathode on a side of the third terminal.

11. The switching circuit according to claim 1, wherein the normally-off junction field-effect transistor includes a gate portion composed of a p-type nitride semiconductor and a gate electrode in ohmic contact with the p-type nitride semiconductor.

* * * * *